United States Patent
Mizuno

[19]
[11] Patent Number: 5,872,027
[45] Date of Patent: Feb. 16, 1999

[54] MASTER SLICE TYPE INTEGRATED CIRCUIT SYSTEM HAVING BLOCK AREAS OPTIMIZED BASED ON FUNCTION

[75] Inventor: Masao Mizuno, Suwa, Japan

[73] Assignee: Seiko Epso Corporation, Tokyo, Japan

[21] Appl. No.: 21,406

[22] Filed: Feb. 10, 1998

Related U.S. Application Data

[62] Division of Ser. No. 283,766, Aug. 1, 1994, Pat. No. 5,796,129.

[30] Foreign Application Priority Data

Aug. 3, 1993 [JP] Japan .................................. 5-192541

[51] Int. Cl.⁶ ..................................................... H01L 21/82
[52] U.S. Cl. ............................................ 438/129; 438/599
[58] Field of Search .................................... 438/128, 129, 438/130, 598, 599

[56] References Cited

U.S. PATENT DOCUMENTS

| | | | |
|---|---|---|---|
| 4,745,084 | 5/1988 | Rowson et al. | 438/129 |
| 4,893,168 | 1/1990 | Takahashi et al. | 438/599 |
| 4,960,724 | 10/1990 | Watanabe et al. | 438/129 |
| 5,063,430 | 11/1991 | Mori | 257/202 |
| 5,171,701 | 12/1992 | Nagamatsu | 438/599 |

FOREIGN PATENT DOCUMENTS

| | | |
|---|---|---|
| A-58-51536 | 3/1983 | Japan . |
| 1-208840 | 8/1989 | Japan . |
| A-2-268464 | 11/1990 | Japan . |
| 3-74873 | 3/1991 | Japan . |
| A-3-145762 | 6/1991 | Japan . |
| A-5-48050 | 2/1992 | Japan . |
| 5-82726 | 4/1993 | Japan . |

*Primary Examiner*—Chandra Chaudhari
*Attorney, Agent, or Firm*—Oliff & Berridge, PLC

[57] ABSTRACT

A master slice type gate array has a plurality of block areas. Each block area includes a plurality of basic cells arranged in a matrix. Different block areas have transistors with different channel widths. Within each of the block areas, a plurality of basic cells are connected to one another through a wiring layer to form function cells. First layer wirings for the function cells are completed within an area between rows of power source wirings Vdd and Vss of the first layer in the transverse direction. Contacts for connecting the sources and drains of P- and N-channel type MOS transistors to the first layer wirings are arranged in rows. Even if the channel widths are changed, the position of the contacts for forming the function cells and the wiring pattern remain unchanged for every block. Therefore, the master slice type gate array can be optimized for various performance parameters such as speed, integration, power consumption and other factors. As a result, the number of steps required to arrange the function cells can be reduced.

6 Claims, 20 Drawing Sheets

MASTER SLICE TYPE INTEGRATED CIRCUIT SYSTEM HAVING BLOCK AREAS OPTIMIZED BASED ON FUNCTION

This is a Divisional of application Ser. No. 08/283,766 filed Aug. 1, 1994, now U.S. Pat. No. 5,796,129.

BACKGROUND OF THE INVENTION

1. Field of the Invention

The present invention relates to a master slice type integrated circuit system and particularly to such an integrated circuit system which can set the channel width of a transistor at the optimum level in a Large Scale Integration LSI chip for every block area thereof to optimize the speed, power consumption, integration and other factors depending on the circuit function. The present invention also concerns a method of making such an integrated circuit system.

2. Description of the Prior Art

A gate array, which is one form of the master slice type integrated circuit systems, comprises basic cells 2 disposed on the central area 1a of a chip 1 in the form of a matrix and input/output cells 5 disposed on the peripheral area 1b of the chip 1 in the form of a ring surrounding the basic cell matrix, as shown in FIG. 2.

Each of the basic cells 2 comprises a plurality of active elements. A plurality of such basic cells 2 are connected together by wiring to form a function cell having a logical function.

The input/output cells 5 disposed on the peripheral area 1b of the chip 1 also connected together by wiring to form an input/output function cell having a logical function. An area 4 between the central and peripheral areas 1a, 1b of the chip 1 serves as an exclusive wiring area for connecting the input/output cells 5 to the internal function cells.

In such a conventional sea-of-gate type gate array as shown in FIG. 2, the basic cells 2 have the same configuration throughout the chip, including the same channel widths Wp and Wn of the P- and N-channel type MOS transistors which define the basic cells 2.

For such a reason, the prior art is limited in that even if function blocks such as RAM, ROM and other blocks are to be formed, they must necessarily be composed of the basic cells of the same configuration. If a RAM is to be made, the area of a memory cell per one bit will be over ten times larger than that of the custom design. Since such a memory cell has its unnecessarily large capacitance, the entire LSI will have an increased power consumption. The formation of a large-capacity RAM in the sea-of-gate type gate array of the prior art is of almost no practical use in the viewpoint of economy such as integration, power consumption and others.

As a result of that the circuits have been increased in the scale, the efficiency of the gate array pursuing only higher wiring rate and speed is extremely inferior to that of an optimized custom chip which is designed to minimize a so-called speed/consumption impulse and to maximize the integration even if they have the same logical function.

It may be believed that this results from the highest priority of reduction of the time for delivery for producing many kinds of gate arrays with small production at the sacrifice of speed, power consumption and integration which should be primarily pursued in LSI.

On the other hand, it is said that in developing such system-on-silicon LSI, the number of gates for practically disposing function cells by such an automatic placement and routing as in the gate array without consideration of the floor plan is limited to twenty or thirty thousands.

It is thus predicted that such a large-scaled circuit as will be developed is in the form of a chip which includes a plurality of system clocks, bus lines, RAMs, ROMs, ALUs and registers through the entire system and further has various different logic circuits. However, we cannot adopt a full custom design which provides different channel length and width of transistors for every function cell to optimize the speed, integration and power consumption for every function block.

This is because the specification and design of the system will necessarily be changed during development of such a large-scaled circuit. In such a case, the production of LSI must basically be restarted from the first step. This leads to the delayed time for delivery and associated cost which are several times larger than those of a gate array in which the specification thereof can be changed only by changes of the wiring step.

Techniques for forming MOS transistors having different channel widths and transistor sizes in one LSI chip are disclosed in Japanese Patent Application Laid-Open No. 58-51536 and Japanese Patent Application Laid-Open Nos. 3-145762, 2-268464 and 5-48050.

In the technique of Japanese Patent Application Laid-Open No. 58-51536, gate electrodes 402 are formed on the upper layers of N- and P-type diffusion regions 400, 401 to form MOS type transistors, as shown in FIG. 18. The MOS type transistors are different in channel width W from one another in the LSI chip.

According such a technique, however, the patterns of the wiring layers (not shown) formed on the upper layers of the gate electrodes 402 are also variable. When the gate electrode 402 is to be connected to the wiring layer on the upper layer thereof according to the prior art shown in FIG. 18, contacts must be formed on enlarged area portions 402a and 402b formed outside of the N- and P-type diffusion regions 400, 401 at the opposite ends of the gate electrode 402. When the channel widths W are to be increased, the positions of the enlarged area portions 402a, 402b must be placed outside of the N- and P-type diffusion regions 400, 401.

According to the invention of Japanese Patent Application Laid-Open No. 58-51536, therefore, the positions of contacts and the patterns of the wiring layers are variable if it is particularly wanted to increase the channel width W, For such a reason, the wiring step including the design of exposure mask is required to be re-designed.

In the technique of Japanese Patent Application Laid-Open No. 3-145762, two smaller P-type diffusion regions 410 and two smaller N-type diffusion regions 411 are formed with gate electrodes 412 being formed on the upper layers of the respective diffusion regions 410 and 411 to provide first basic cells, as shown in FIG. 19. A common gate electrode 422 is formed on the upper layers of larger N- and P-type diffusion regions 420, 421 to provide a second basic cell as shown in FIG. 20. Thus, two types of MOS transistors having different channel widths are formed.

Also in the invention of Japanese Patent Application Laid-Open No. 3-145762, however, the positions of the enlarged area portions 412a and 422a must similarly be changed if it is wanted to increase the channel widths of FIGS. 19 and 20. The contact positions and wiring patterns must also be changed.

The invention of Japanese Patent Application Laid-Open No. 2-268464 forms a common gate electrode over four diffusion regions 410 and 411 shown in FIG. 19. Basically, this is of the same structure as that of the first basic cell disclosed in the Japanese Patent Application Laid-Open No. 3-145762.

In the usual steps of designing and producing such a LSI, the channel width of the MOS transistor must frequently be changed due to the change of fan-out resulting from the logical simulation. Even if the channel width or transistor size is to be optimized for every design as in the aforementioned three proposals, the change of channel width is necessarily associated with the designing and producing steps. This cannot practically be accomplished if the wiring step is greatly changed.

According to the invention of Japanese Patent Application Laid-Open No. 5-48050, P- and N-type diffusion regions having different channel widths are juxtaposed in one direction. When the contact positions and wiring patterns are changed, a MOS transistor having an appropriate one of the channel widths is formed. This invention greatly reduces the efficiency of gate utilization, since the number of wiring steps corresponding to the number of channel widths is required, and there is always some diffusion regions having unnecessary channel widths.

SUMMARY OF THE INVENTION

It is therefore an object of the present invention to provide a master slice type integrated circuit system which can be more optimized as LSI about the speed, power consumption and integration and yet easily be accommodated to changes of specification and design which are necessarily created in the step of LSI production, and a method of making such an integrated circuit system.

Another object of the present invention is to provide a master slice type integrated circuit system which can easily predict the electrical characteristics of the respective function cells each defined by a plurality of basic cells which are composed of MOS transistors having different channel widths in order to improve the design accuracy in the logical simulation.

Still another object of the present invention is to provide a master slice type integrated circuit system which can be accommodated to various source voltages or mixedly include various logical levels while intending to optimize the speed, power consumption and integration of the LSI chip.

The present invention therefore provides a master slice type integrated circuit system comprising:
  a plurality of basic cells disposed in a matrix within each of a plurality of divided block areas in an LSI chip;
  a plurality of first wiring layers positioned over a plurality of said basic cells for connecting at least one row of said basic cells to one another in said block areas to form a function cell having a logical function; and
  power wiring layers Vdd and Vss formed in the same plane as said first wiring layers parallel to said row of said basic cells and supplying the power to said basic cells,
  each of said basic cells within said block areas including two or more P-channel type MOS transistors having their sources connected together or drains connected together and two or more N-channel type MOS transistors having their sources connected together or drains connected together, said P- and N-channel type MOS transistors being disposed opposite to each other, the channel widths Wp and Wn of the P- and N-channel type MOS transistors of the basic cells within at least one of said block areas are different from those of the basic cells within the other block areas,
  said integrated circuit system further comprising a plurality of first contacts for connecting the sources and drains of said P- and N-channel type MOS transistors with said plurality of first wiring layers and a plurality of second contacts for connecting the gates of said transistors with said first wiring layers, said first and second contacts having the relative position to said power wiring layers Vdd and Vss which is invariable irrespectively of the magnitudes of the channel widths Wp and Wn.

In such an arrangement, one chip is previously divided into function blocks in each of which the basic cells having a transistor channel width optimum for the required performance thereof are disposed. The basic cells are arranged within each of the function blocks in a matrix and covered with a wiring to form a function cell. Thus, the LSI can have its optimized speed, power consumption and integration, compared with the prior art gate array in which the transistor channel width is invariable throughout the chip.

The contacts of the basic cell connecting the sources, drains and gates of its P- and N-channel type transistors to the first wiring layer (first and second contacts) have their invariable positions relative to the power wiring layers Vdd and Vss irrespectively of the magnitude of the channel widths Wp and Wn. Even if the channel widths of the P- and N-channel type transistors in the basic cell are increased several times, a function cell formed by such basic cells can use the same wiring pattern of the first wiring layer. As a result, the wiring step will not be affected by any change in the channel widths of the MOS transistors resulting from the fan-out changed through the logical simulation.

Within each of the block areas, it is preferable that a plurality of such first contacts are arranged in a row parallel to the P- and N-channel type MOS transistors. This facilitates the positioning of the first contacts within the minimum channel width. When the first contacts are positioned in such a manner, the same determined position of the first contacts can be used subsequently even if the channel widths are changed.

It is preferable that the second contacts are disposed in an area between the P- and N-channel type MOS transistors arranged opposite to each other. This will not require changing the position of the second contacts when the channel widths are to be extended in the opposite direction to the associated MOS transistor.

The first and second contacts may be disposed within an area between the power source wiring layers Vdd and Vss. Thus, the wiring of the first wiring layer for the function cells will be completed between the power wiring layers Vdd and Vss when it is to form a function cell having a logical function by connecting the basic cells through the first wiring layer in a row.

It is further preferable that the ratio of the channel width Wp to the channel width Wn (Wp/Wn) of the basic cells within each of block areas is set to be the same with that in other block areas.

When the ratio Wp/Wn in each of the basic cells are the same in all block areas, there is a similarity in shape between the transistors of the basic cells even if the channel widths are changed. In such a case, most of the electrical characteristics of the function cells defined by the basic cells (speed, power consumption, input capacity, output drive capacity and others) will be proportional to one another. Therefore, in logical simulation, the characteristics of the basic cells in each of the block areas can more easily be predicted to facilitate the design.

The basic cells in at least one block area may have a ratio of channel widths (Wp/Wn) which is different from those of the other blocks within a certain extent. As the channel widths Wp and Wn are changed, the characteristic value β of the transistors will also be changed. This value β is a factor determining, for example, a threshold when a logic circuit is used as an inverter. Thus, the system can deal with various power voltages such as 3.5 V, 5 V and others. Alternatively, a logical level optimum for a logic circuit can be determined by the ratio of channel widths. Thus, an LSI responsive to a plurality of different power sources or mixedly including a plurality of logical levels can be realized.

A plurality of the gate electrodes may be disposed substantially parallel to one another between the opposed P- and N-channel type MOS transistors. The opposite ends of each of the gate electrode function as the gates in the transistors. This can reduce the number of second contacts and simplify the patterns of the first wiring layers.

It is further preferable that an island-like wiring layer having a third contact for connecting said island-like wiring layer to the first wiring layer is formed in the same plane as the gate electrodes at an area between the gate electrodes. The island-like wiring layer is formed of the same conductive material as that of the gate electrodes.

This can reduce the number and area of second wiring layers formed over the first wiring layers and the number of VIAs connecting between the first and second wiring layers.

A power source reinforcing wiring layer can be formed at an area enlarged by providing the island-like wiring layer in the same plane as the second wiring layers out of the areas which are occupied by the second wiring layers. In other words, any empty area in which there is no second wiring layer can be utilized to form a relatively wide power source reinforcing wiring layer. This increases the freedom for forming the power source reinforcing wiring layer.

Input/output cells are disposed in the peripheral area of the LSI chip. A plurality of block areas can be disposed close to one another or spaced apart from one another in the inside area of the LSI chip. When the block areas are disposed close to one another, exclusive wiring areas for connecting the input/output cells to the function cells in the blocks are formed only between the block areas and the input/output cells. If the block areas are disposed spaced apart from one another, an exclusive wiring area may be formed between adjacent block areas in addition to the areas between the block areas and the input/output cells.

The function cells in one of the block area define a memory while the function cells in another block form a high-speed operation part. The basic cells in said one block area are set to have their channel widths Wp and Wn smaller than those of the basic cells in said another block area.

Thus, the block area defining the memory can utmost be reduced in occupying area and power consumption while the block area forming the high-speed operation part can be increased in occupying area, but secure a higher computing speed.

The function cells in one of the block area form a clock driver while the function cells in another block area define a high-speed operation part. The basic cells in said one block area are set to have their channel widths Wp and Wn larger than those of the basic cells in said another block area.

Thus, the clock driver can be caused to output a higher driving force while securing the high computing speed in the high-speed operation unit.

Two or more block areas can include function cells having the same function, while the basic cells defining these function cells have different channel widths. In such a case, due to the above-mentioned structure these function cells having the same function and different channel widths can be set to have the same arrangement of the first and second contacts and the same wiring patterns of the first wiring layers.

The present invention also provides a method of making a master slice type integrated circuit system defining any one of various LSI chips by dividing a semiconductor substrate into a plurality of block areas, disposing P- and N-channel type MOS transistors having channel widths predetermined in every block area, in an opposed relationship to form basic cells within each of the block areas and by wiring at least one row of said basic cells in each of the block areas, said method comprising the steps of:

(a) forming P- and N-wells in adjacent areas within each of said block areas on the semiconductor substrate;

(b) forming LOCOS(Local Oxidation of Silicon) in the field parts of said P- and N-wells, and thinner oxide films in areas other than said field parts;

(c) covering said LOCOS and thinner oxide films with a polysilicon layer;

(d) etching said polysilicon layer to form gate electrodes each having a length corresponding to the channel width predetermined in every block area;

(e) ion-implanting N- and P-type impurities into said P- and N-wells through self-alignment of said gate electrodes to form N- and P-type diffusion regions having their channel widths predetermined in every block area;

(f) thereafter forming a first insulation film and forming first contact holes at positions opposing to said N- and P-type diffusion regions and second contact holes at a position opposing to said gate electrodes; and (g) forming, on said first insulation layer, a first wiring layer for connecting said basic cells in each of said block areas to one another at least in one row to form a function cell and power source wiring layers Vdd and Vss for supplying the power to the function cells, said first and second contact holes in each of said block areas being disposed in an area between said power source wiring layers Vdd and Vss, the wiring by said first wiring layer for forming the function cells being completed within an area between said power source wiring layers Vdd and Vss irrespectively of the magnitude of said channel widths.

According to this method, at least the steps (d) and (e) must be changed depending on possible changes of the channel widths during or after the steps (a) to (c). The wiring by the first wiring layer for forming the function cells is completed within the area between the power source wiring layers Vdd and Vss irrespectively of the magnitude of the channel widths. In other words, the position of first and second contacts as well as the pattern of the first wiring layer for the function cells can be invariable even if the channel widths are changed. Therefore, the steps (f) and (g) can be carried out according to the predetermined design relating to the position of first and second contacts as well as the pattern of the first wiring layer. The steps (a) to (c), which steps require relatively more time in all steps, can proceed independently of the channel widths. Therefore, semiconductor substrates can be stocked after the end of the step (c) to shorten the time for delivery.

BRIEF DESCRIPTION OF THE ACCOMPANY DRAWINGS

DETAILED DESCRIPTION OF THE PREFERRED EMBODIMENTS

The present invention will now be described by way of example with reference to the drawings.

First Embodiment

Figure 1:
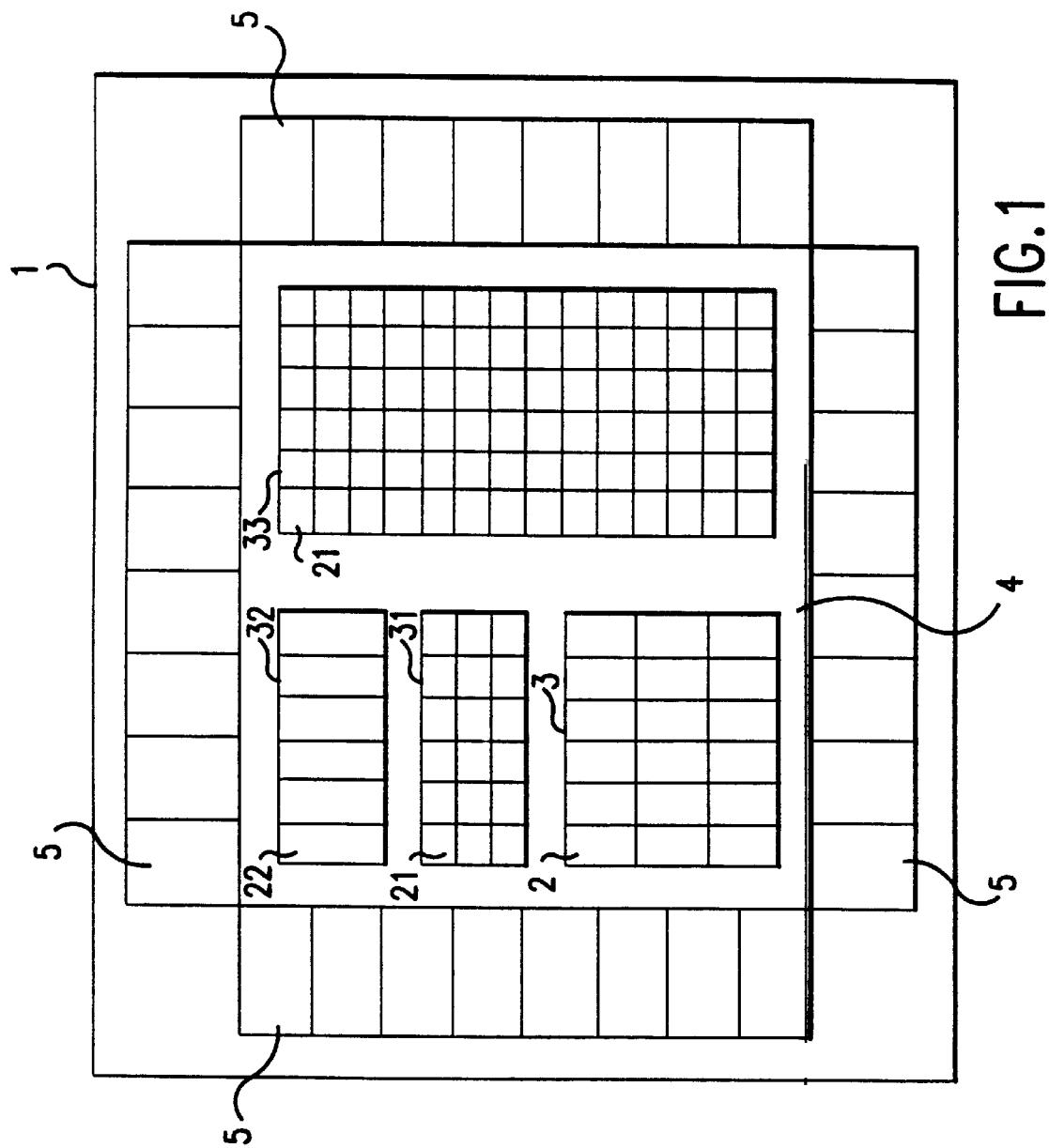
FIG. 1 is a schematic plan view of the whole chip according to one embodiment of the present invention.
Figure 2:
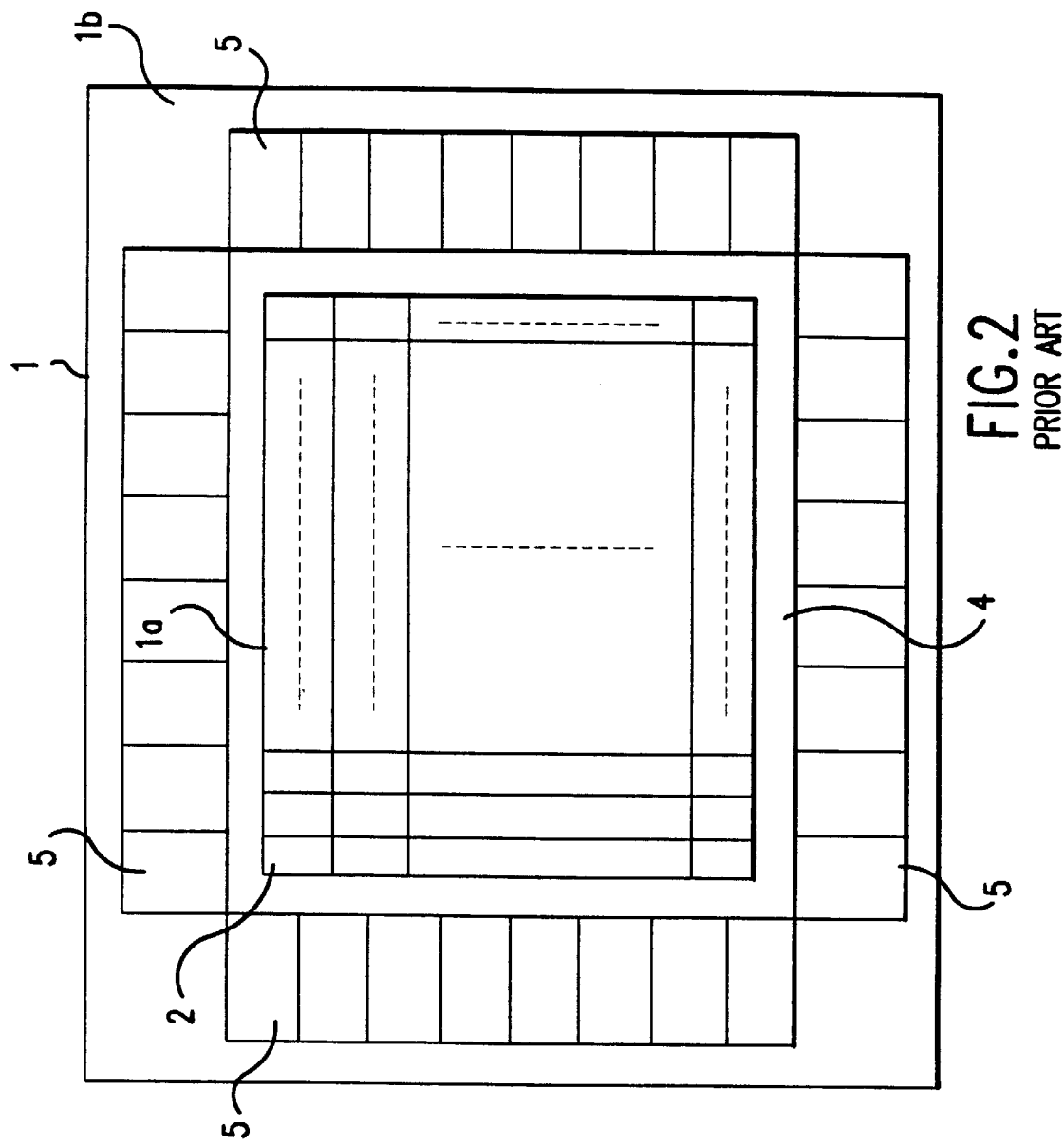
FIG. 2 is a schematic plan view of the whole chip according to the prior art gate array system.

FIG. 1 is a schematic plan view of a chip according the first embodiment of the present invention. The chip 1 is of a square configuration and has four peripheral sides on which input/output cells 5 are disposed in an annular configuration. Inside the annular array of input/output cells 5, the chip is divided into four blocks 3, 31, 32 and 33. Each of the divided block areas 3–33 includes basic cells disposed in a matrix. Basic cells 2 are disposed in the block area 3; basic cells 21 are arranged in the block areas 31 and 33; and basic cells 22 are arranged in the block area 32. The basic cells 21 in the block areas 31 and 33 are not different from one another while the basic cells 2 and 22 in the block areas 3 and 32 are different from one another. Differences between the basic cells 2, 21 and 22 only relate to different channel widths of P- and N-channel type MOS transistors which will be describe later. Areas inside the annular input/output cells 5 and outside the block areas 3, 31 and 33 are exclusive wiring areas 4.

In each of the block areas 3–33, a plurality of basic cells 2, 21, 22 and 21, respectively, are connected to one another through wirings on the upper layer to form function cells having logical functions. The function cells prepared only through the wiring layers may be disposed on basic cells of different type.

The input/output cells in the peripheral portion of the chip 1 also are wired to one another to form function cells having logical function. The input/output cells 5 are connected to the function cells inside thereof through the exclusive wiring areas 4.

Figure 3:
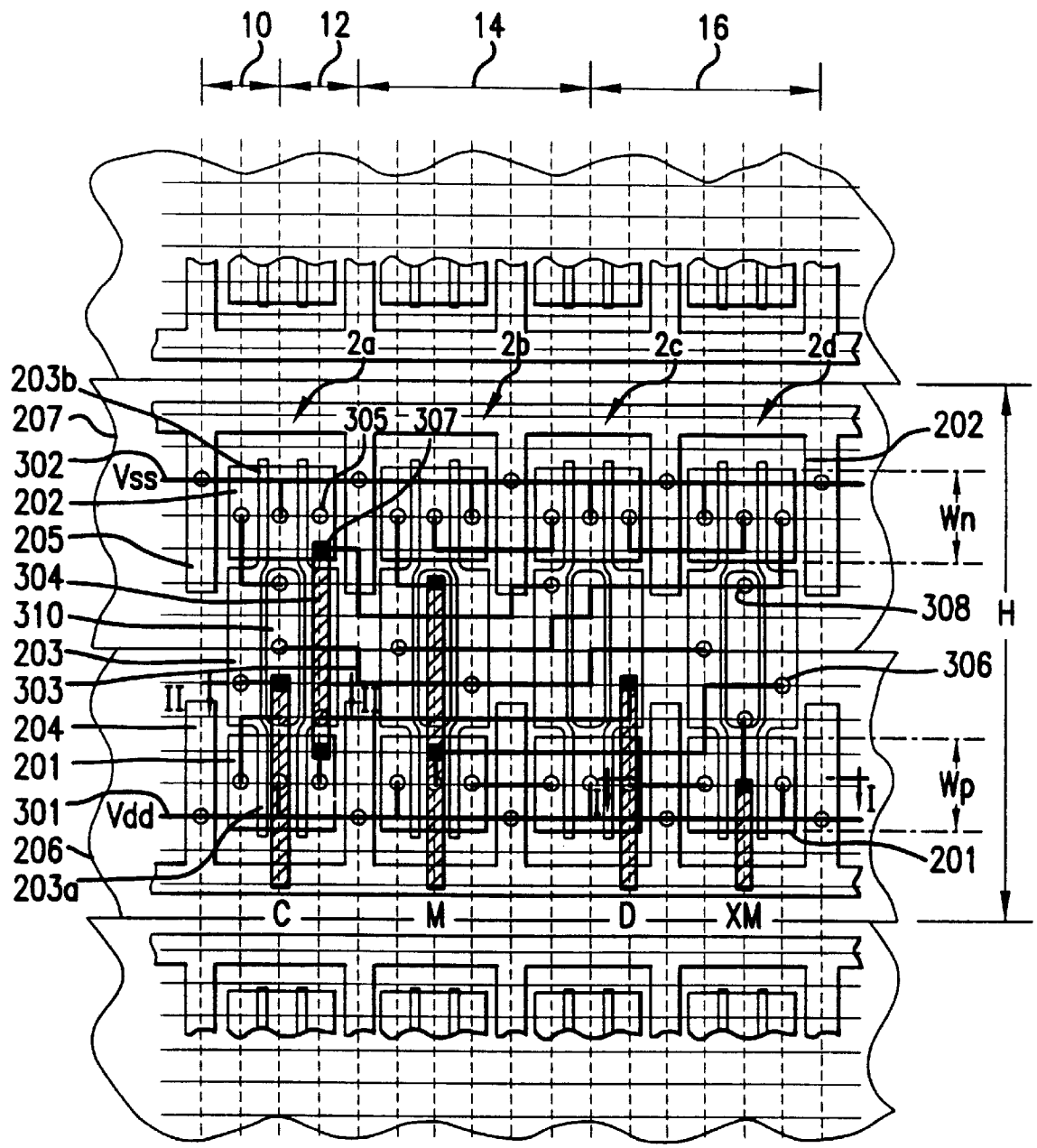
FIG. 3 is a layout of a latch circuit according to the present invention when transistors have channel widths similar to those of the conventional gate array.
Figure 4:
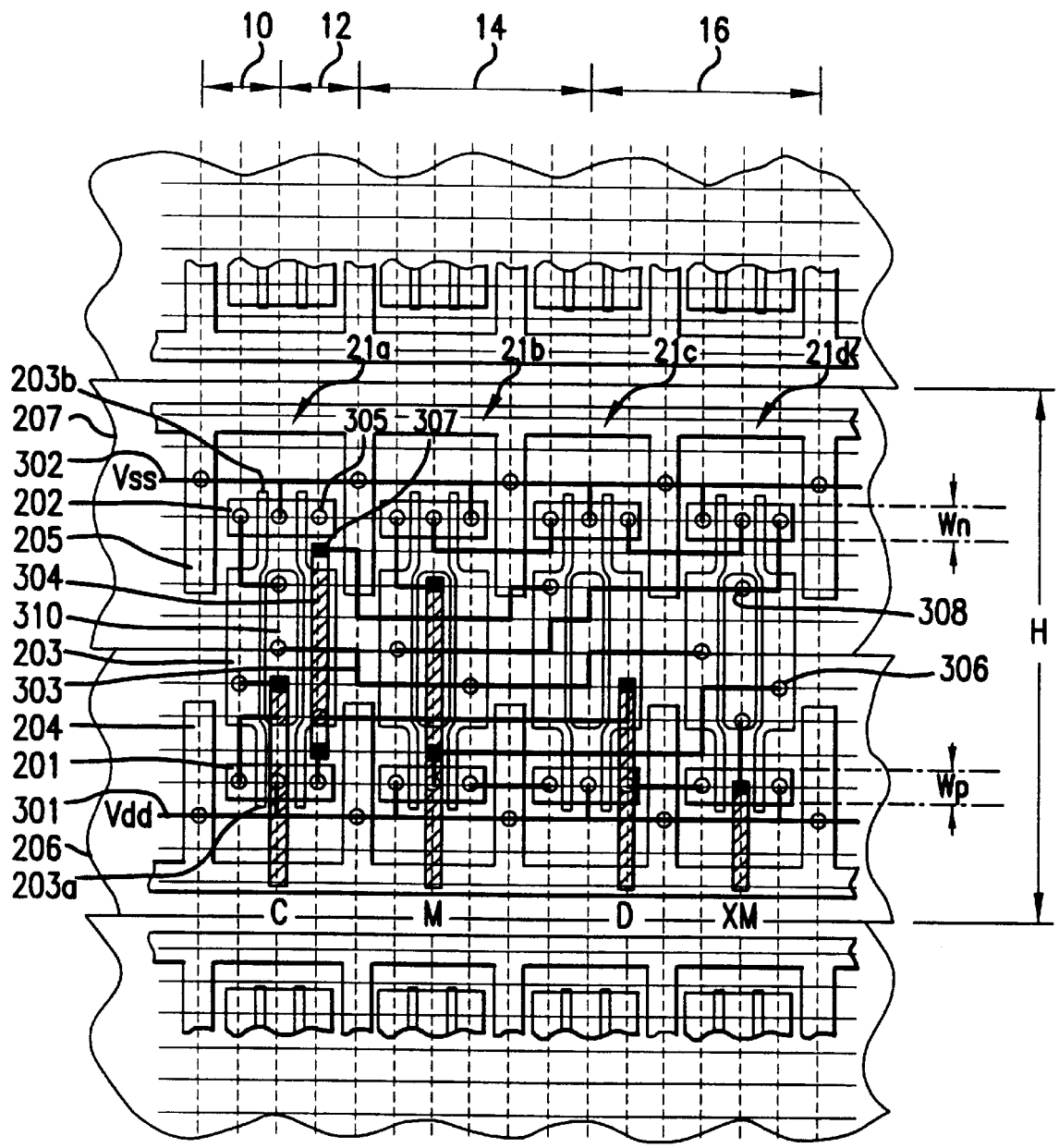
FIG. 4 is a layout of a latch circuit according to the present invention when the channel widths of the transistors are reduced to use in a low-power circuit block.
Figure 5:
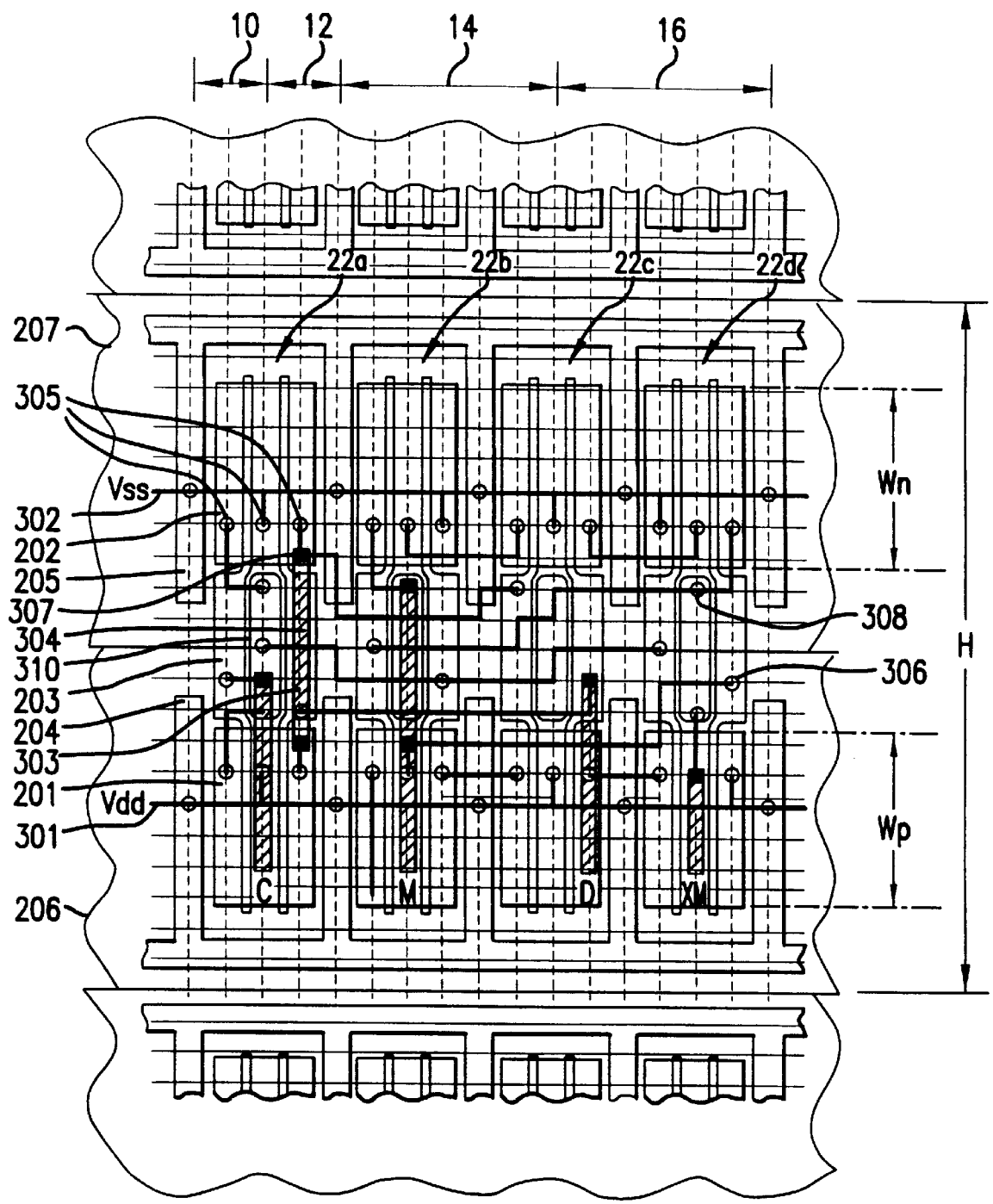
FIG. 5 is a layout of a latch circuit according to the present invention when the channel widths of the transistor are increased to use in a high-power and high-speed circuit block.
Figure 8:
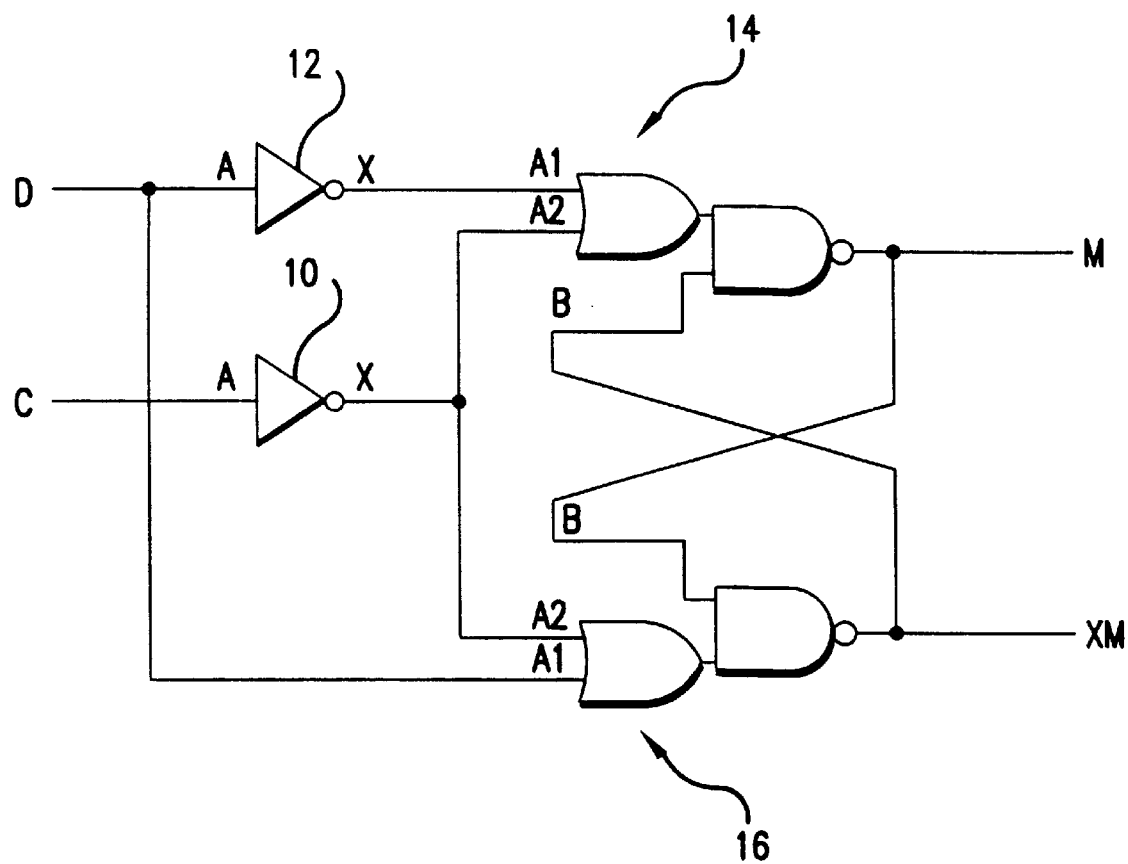
FIG. 8 is a logic symbol diagram of the latch circuit.

FIGS. 3, 4 and 5 show the layout of basic cells and wirings when the basic cells 2, 21 and 22 are connected together in a plurality of transverse directions to form a latch circuit shown in FIG. 8. In each figure, Wn denotes the channel width of the N-channel type MOS transistors while Wp designates the channel width of the P-channel type MOS transistors. In the first embodiment, the ratio of channel widths, that is, Wp/Wn is equal to one. As can be seen from FIGS. 3–5, the channel widths Wn and Wp of FIG. 4 are minimum; the channel widths Wn and Wp of FIG. 5 are maximum; and the channel widths Wn and Wp of FIG. 3 are intermediate between the minimum and maximum values.

Figure 6:
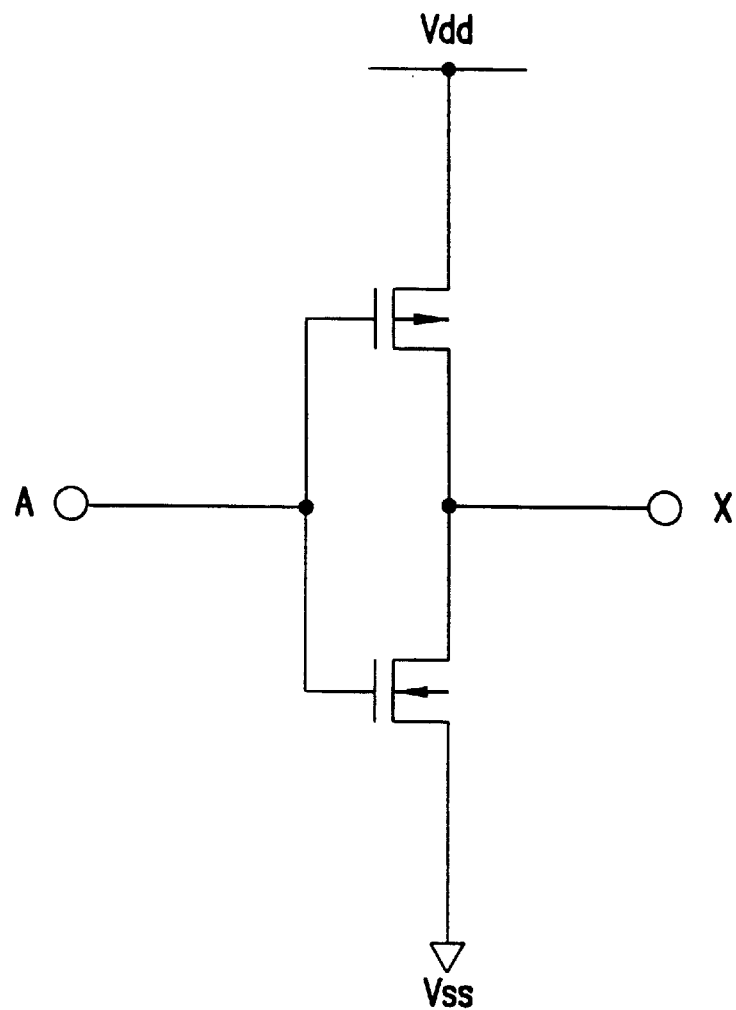
FIG. 6 is a circuit diagram of transistors in an inverter.
Figure 7:
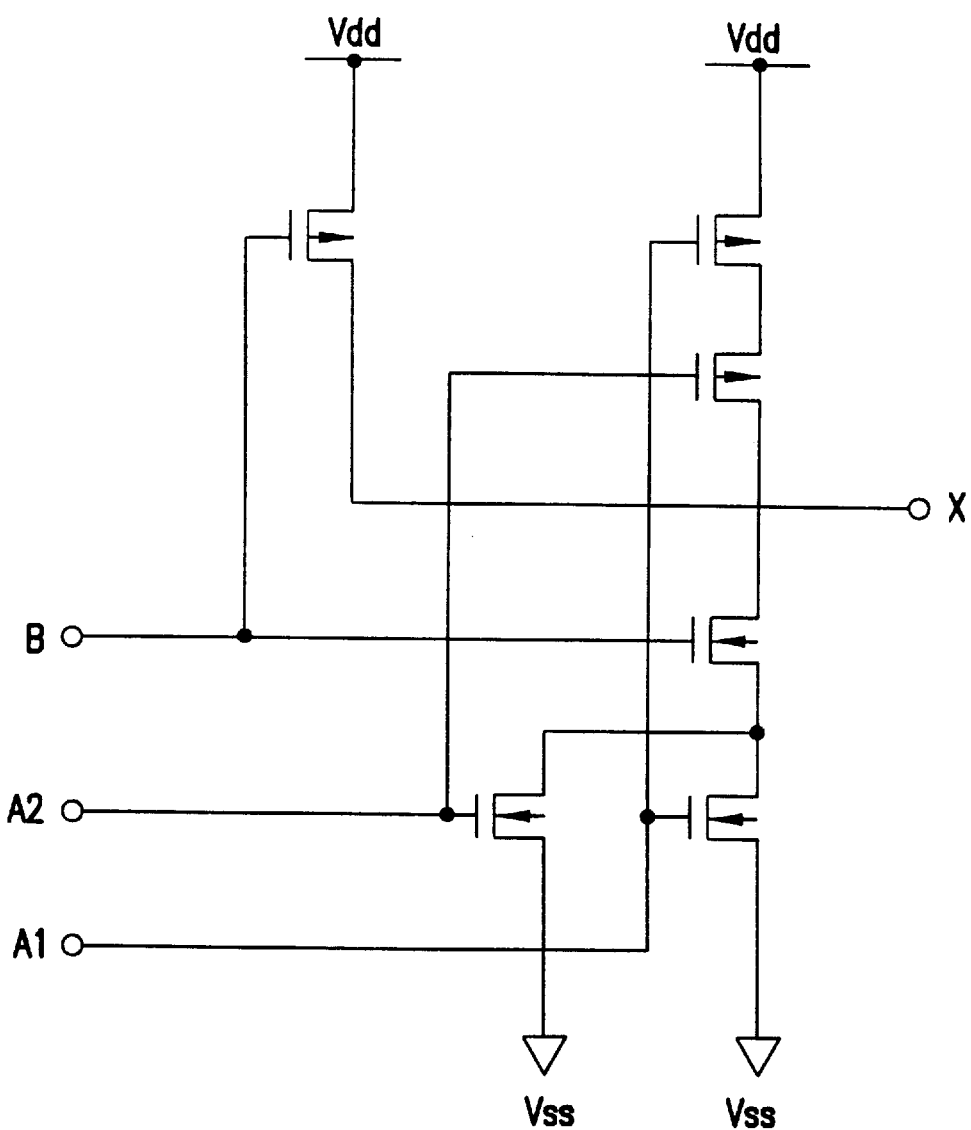
FIG. 7 is a circuit diagram of transistors in an OR-NAND.

The latch circuit shown in FIG. 8 comprises first and second inverters 10, 12 and first and second OR-NANDs 14, 16. FIG. 6 shows the transistor circuit of the first and second inverters 10 and 12 while FIG. 7 shows the transistor circuit of the first and second OR-NANDs 14 and 16. In FIGS. 3–5, the areas defining the first, second inverters 10 and 12 and the first, second OR-NANDs 14 and 16 shown in FIG. 8 are denoted by the symbols of the corresponding logic circuits. In FIGS. 3–5, the inputs/outputs to each of the logic circuits shown in FIGS. 6–8 are designated by the corresponding symbols C, D, M and XM.

In the layouts of FIGS. 3, 4 and 5, N-well and P-well areas 206, 207 are respectively formed in lower and upper areas which are provided by transversely dividing the circuit region. The N-well area 206 includes a plurality of P-type diffusion areas 201 formed therein on the opposite sides of a stopper N-type diffusion area 204. On the other hand, the P-well area 207 includes a plurality of N-type diffusion areas 202 formed therein on the opposite sides of a stopper P-type diffusion area 205. On the N- and P-well areas 206 and 207, polysilicon areas 203 are formed to extend in the longitudinal direction until the opposite ends thereof reach the upper layers of the P- and N-type diffusion areas 201, 202, respectively. Each of the polysilicon areas 203 is a gate electrode for the P- and N-channel type MOS transistors, the opposite ends thereof functioning as gates 203a and 203b, respectively.

In the case of FIG. 3, a first train of basic cells 2a, a second train of basic cells 2b, a third train of basic cells 2c and a fourth train of basic cells 2d are formed, starting from left, through the P- and N-type diffusion areas 201, 202 and gates 203a, 203b. In the case of FIGS. 4 or 5, similarly, a first train of basic cells 21a or 22a, a second train of basic cells 21b or 22b, a third train of basic cells 21c or 22c and a fourth train of basic cells 21d or 22d are formed.

In FIGS. 3, 4 and 5, further, each train of basic cells is formed by two P-channel type MOS transistors and two N-channel type MOS transistors being disposed opposed two P-channel type MOS transistors. The central region between two gates 203a in the P-type diffusion area 201 is a common P-type diffusion area corresponding to one of a source and a drain in each of two P-channel type MOS transistors. The central region between two gates 203b in the N-type diffusion area 202 is a common N-type diffusion area corresponding to one of a source and a drain in each of two N-channel type MOS transistors. In the first trains of basic cells 2a, 21a, 22a and third trains of basic cells 2c, 21c, 22c, the central region of the P-type diffusion area 201 is a common source and the central region of the N-type diffusion area 202 is a common source. Therefore, the first trains of basic cells 2a, 21a, 22a, and third trains of basic cells 2c, 21c, 22c are formed by two P-channel type MOS transistors connected in source with each other and two N-channel type MOS transistors connected in source with each other, these P- and N-channel type MOS transistors being disposed opposed to one another. On the other hand, the second trains of basic cells 2b, 21b, 22b and fourth trains of basic cells 2d, 21d, 22d are formed by two P-channel type MOS transistors connected in drain with each other and two N-channel type MOS transistors connected in drain with each other, these P- and N-channel type MOS transistors being disposed opposed to one another.

A wiring structure electrically connecting the basic cells in one block will be described. Such a wiring structure will be described only in connection with FIG. 3 since the same wiring structure can be used in FIGS. 4 and 5.

First layer Vdd metal line 301 and first layer Vss metal line 302 are formed on the upper layer of the basic cells in the transverse direction as viewed in FIG. 3, along which direction the basic cells are connected together. First layer metal lines 303 are formed in the same layer as the metal lines 301 and 302 both in the longitudinal and transverse directions. Second layer metal lines 304 are formed in the upper layer of the first layer metal lines 301–303 to extend in the longitudinal direction. In FIGS. 3–5, the first layer metal lines 301–303 are shown by thicker solid lines while the second layer metal lines 304 are shown by hatching. First contacts 305 are provided to connect the first layer metal lines 302–303 to the P- and N-type diffusion areas 201 and 202. In this embodiment, the first contacts 305 are formed three on each of the P- and N-type diffusion areas 201 and 202. The first contacts 305 in each of the P- and N-type diffusion areas 201 and 202 are arranged in line along the transverse direction as viewed in FIG. 3, along which direction the basic cells are connected together. The position in which the first contacts 305 are formed in line is within an area in which the P- or N-type diffusion area 201, 202 having the minimum channel widths Wn and Wp can be arranged, as shown in FIG. 4.

Second contacts 306 for connecting the gate electrodes 203 to the first layer metal lines 303 are also provided. Contact holes or VIAs 307 are further provided for connecting the first layer metal lines 303 to the second layer metal lines 304. These VIAs 307 are shown by blacked circles in FIG. 3.

In this embodiment, further, an island-like wiring layer 310 is formed between two gate electrodes 203 defining one basic cell, for example, a basic cell 2a in FIG. 3. The island-like wiring layer 310 is located in the same layer as the gate electrodes 203 and made of polysilicon which is the same conductive material as that of the gate electrodes 203. Third contacts 308 are provided to connect the island-like wiring layer 310 to the first layer metal lines 303.

As can be seen from FIGS. 3, 4 and 5, the positions of the first layer metal lines 301–303, first to third contacts 305, 306, 308 and VIAs 307 are invariable even if the channel widths Wn and Wp are changed. The second layer metal lines 304 also are located in its invariable position as in FIGS. 3–5. Although only the second layer metal lines 304 are possibly changed when any reinforcement of power source is required, the position of the contacts and VIAs as well as the basic design layout of the first and second layer metal lines are invariable.

Figure 9:
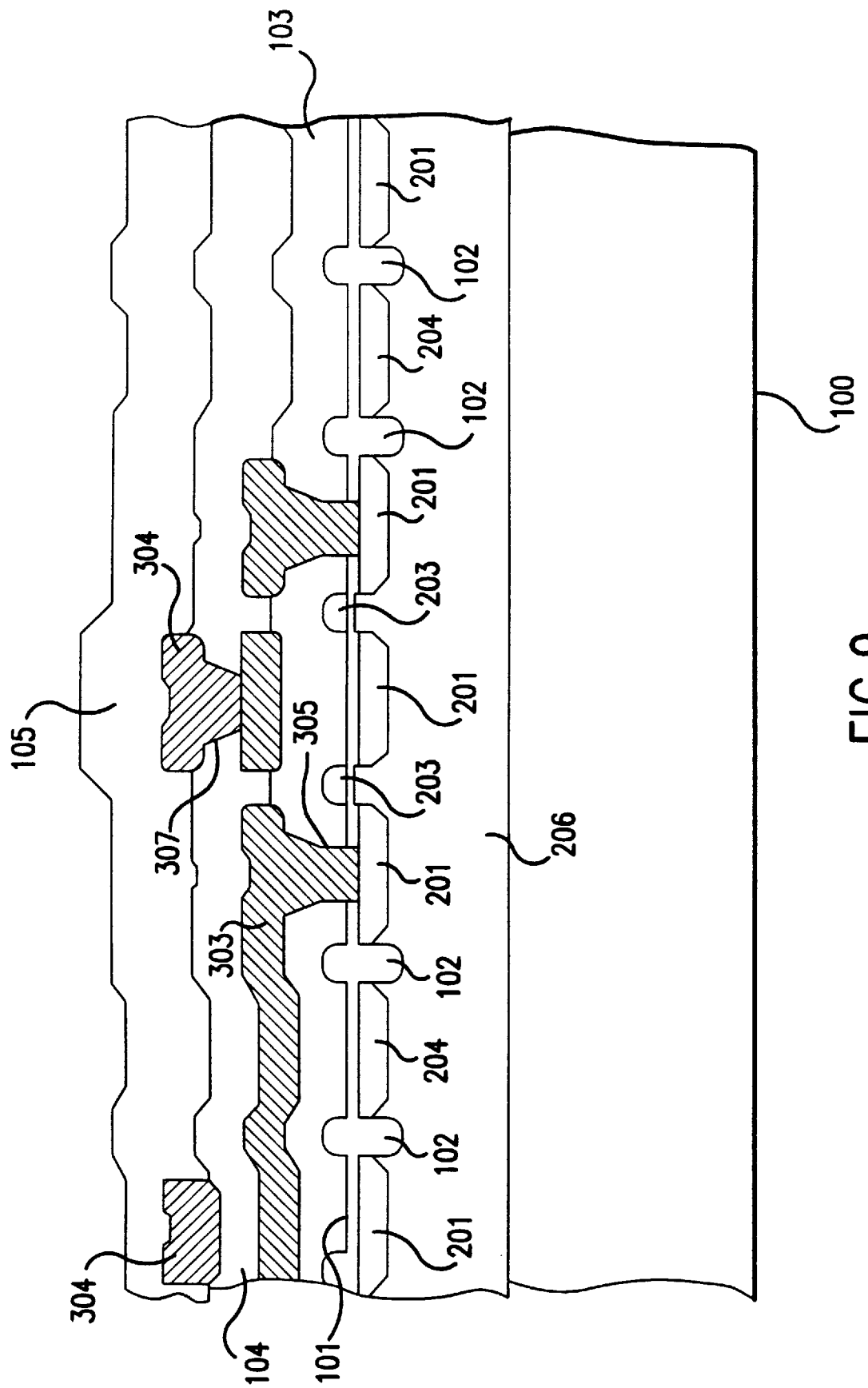
FIG. 9 is a cross-sectional view taken along a line I—I in FIG. 3.
Figure 10:
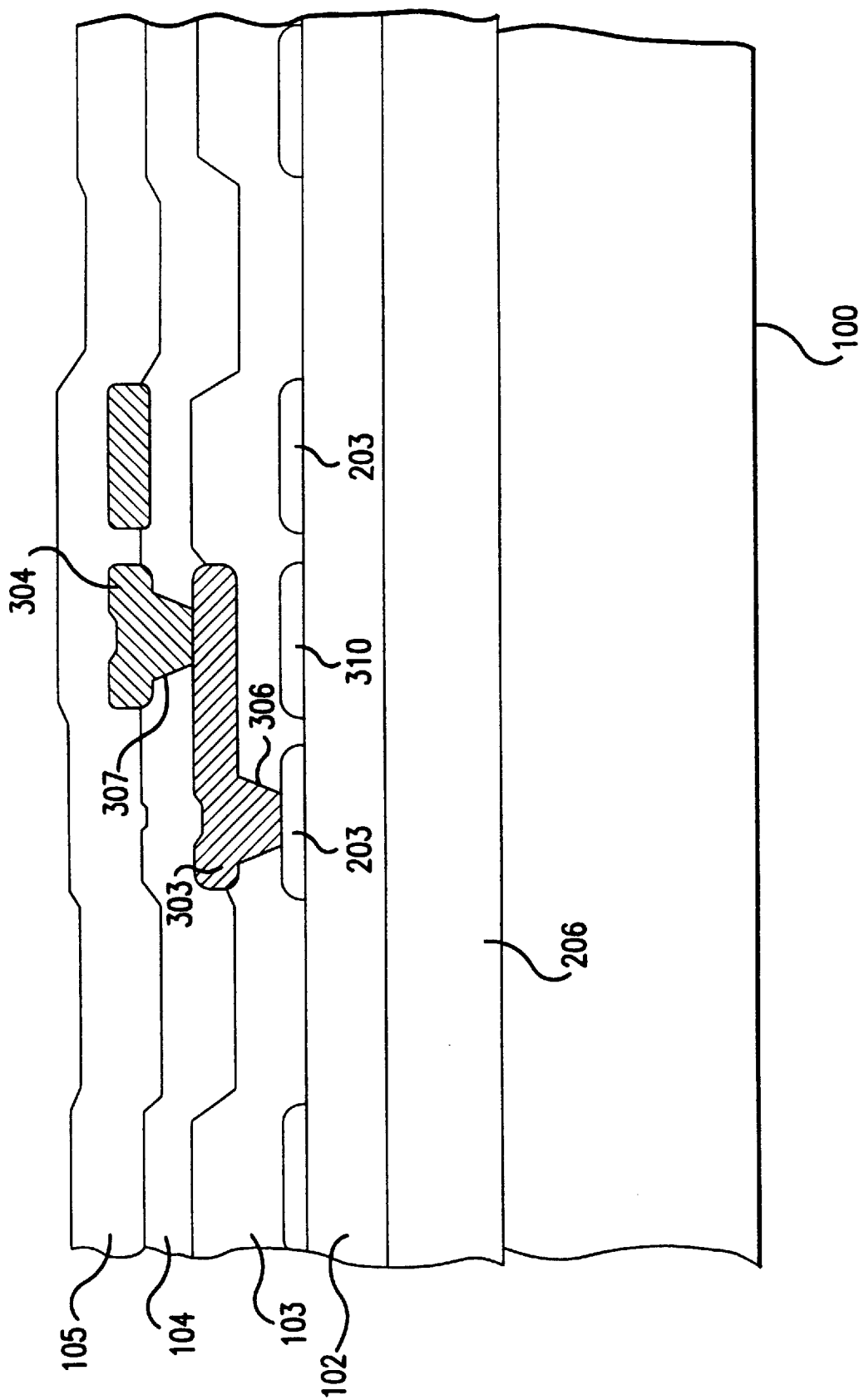
FIG. 10 is a cross-sectional view taken along a line II—II in FIG. 3.

The cross-sectional structure of the LSI having such a structure will be described with reference to FIGS. 9 and 10 following various steps of production. FIG. 9 is a cross-sectional view taken along a line I—I in FIG. 3 while FIG. 10 is a cross-sectional view taken along a line II—II in FIG. 3.

(1) N-Well and P-Well Forming Steps

In order to form N-well and P-well areas 206, 207 on such an N-type silicon substrate 100 as shown in FIG. 9, an oxide film is first formed over the whole surface of the substrate 100. A nitride film is then formed over the oxide film. A portion of the nitride film is removed to form an N-well mask. Thereafter, ions such as phosphorus ions are implanted to form N-well areas 206. Similarly, other ions such as boron ions are implanted to form P-well areas 207.

(2) Device Isolation (LOCOS) Step

After the oxide and nitride films have been removed, a pad oxide film 101 is formed over the silicon substrate 100. Nitride film is formed over the pad oxide film 101 through CVD before the nitride film is removed at field parts. Thereafter, the nitride film is used as a mask to perform the phosphorus ion-implantation to the N-well areas 206 and also the boron ion-implantation to the P-well areas 207. Thus, stopper N- and P-type diffusion areas 204 and 205 are formed.

The silicon substrate 100 is thereafter oxidized, for example, in the atmosphere of wet $O_2$ at a temperature equal to about 1000° C. Through the anti-oxidization of the nitride film, the pad oxide film 101 below the remaining nitride film parts is not oxidized and remains as thin oxide film while the exposed pad oxide film parts are further oxidized. As shown in FIG. 9, this forms LOCOSs 102 as device isolating films. Thereafter, the nitride film is removed to complete the device isolation step.

(3) Polysilicon Film Forming Step

Polysilicon film for the gate electrodes 203 and island-like wiring layer 310 is formed over the whole surface of the silicon substrate 100. The steps (1)–(3) can be carried out independently of the channel widths Wp and Wn of the MOS transistors. Therefore, silicon substrates thus formed may be stocked after the step (3). The steps (1)–(3) require more treating time than those of the other steps through the LSI making process. If silicon substrates formed are stocked after termination of the step (3), they can be delivered immediately in response to the customer's request even if the design is changed in regard to any point.

(4) Polysilicon Area Forming Step

After the channel widths Wp and Wn of the MOS transistors have been determined through the logical simulation, a photolithograph step is carried out to form gate electrodes 203 and island-like wiring layer 310 of polysilicon layer. As shown in FIGS. 3–5, thus, each of the gate electrodes 203 can have, at its opposite ends, gates 203a and 203b of lengths corresponding to the respective channel widths Wp and Wn of the MOS transistors.

(5) N- and P-Type Diffusion Area Forming Step

Ions of P-type impurities such as As ions are implanted onto the polysilicon areas left after the step (4) (i.e., gate electrodes 203 and wiring layer 310) to form P-type diffusion areas 201. Similarly, ions of N-type impurities such as B or $BF_2$ ions are implanted to form N-type diffusion areas 202. At this time, the polysilicon areas 203 and 310 function as self-alignment masks. This self-alignment does not require any centering between different patterns which would be required by the conventional photolithograph process.

(6) First Layer Metal Line Forming Step

After formation of the N- and P-type diffusion areas 201 and 202, a first layer insulation oxide film 103 is formed over the surface of the silicon substrate 100.

Next, contact holes for the first and second contacts 305 and 306 are formed before a metal layer for the first layer metal lines is formed, for example, through aluminum deposition. At the same time, first and second contacts 305 and 306 are formed. Thereafter, the conventional photolithograph process is carried out to form first layer Vdd metal line 301, first layer Vss metal line 302 and first layer metal lines 303.

According to the special arrangement of this embodiment, the first layer metal lines 303 for connecting a plurality of basic cells together in one block area in the transverse direction terminate only in the area between the first layer Vdd metal line 301 and the first layer Vss metal line 302. As can be seen from FIGS. 3–5, particularly, the first layer metal lines 303 can terminate only in the area between the metal lines 301 and 302 even if the channel widths Wp and Wn of the MOS transistors are changed.

Even if the fan-out is changed through the logical simulation to change the channel widths of the MOS transistors, the first layer metal lines 303 will not be changed. Thus, the mask for the first layer metal lines 303 is not required to be changed and can reduce the manufacturing cost as well as the time to delivery. Such a change relating to the specification such as fan-out or the like is always associated with the design of LSI and raises an important problem to how step the making process should go back for restoration. According to this embodiment, silicon substrates can be worked until the step (3) or polysilicon layer forming step independently of changes in the channel widths of the MOS transistors. The silicon substrates thus formed may be stocked. Even if the channel widths are changed, the layout of the first layer metal lines will not be required to be changed. Therefore, the making process can be changed as little as possible, associated with the change of specification.

(7) Second Layer Metal Line Forming Step

After the second layer insulation oxide film 104 has been formed on the upper layer of the first layer metal line, holes for VIAs 307 may be formed together with the second metal film, for example, through the aluminum deposition. The conventional photolithograph process is then carried out to form such a second metal line 304 as shown in FIGS. 3–5. A passivation film 105 as a protection film is formed on the upper layer of the second metal line 304 to terminate the LSI making process.

In the layouts of FIGS. 3, 4 and 5, the ratio of channel widths Wp/Wn in each basic cell is invariable. It can therefore be said that even if the channel widths are changed, the transistors in these basic cells are similar to one another in shape. In such a case, it can be believed that considerable some of the electrical characteristics (speed, power consumption, input capacity, output drive capacity and other factors) in the function cells formed by the basic cells are substantially proportional to one another.

For example, the input capacity is substantially proportional to the gate area of the transistors while the gate area is proportional to the channel widths Wp and Wn. The power consumption is also proportional to the area of source and drain which is in turn proportional to the channel widths Wp and Wn. The output drive capacity is proportional to the transistor value β which is in turn proportional to the channel widths Wp and Wn. If the ratio of channel widths (Wp/Wn) is invariable in such a manner, the relationship between the electrical characteristics of the function cells can be extremely easily predicted.

When the ratio of channel widths (Wp/Wn) in the respective basic cells in each block is invariable, the characteristics of the basic cells in each block area can be easily predicted to facilitate the design through the logical simulation. On the contrary, if the above ratio (Wp/Wn) is randomly changed for every block, the characteristics of the basic cells in each block will be greatly variable, so that time required to develop a new circuit will be greatly increased.

Figure 11:
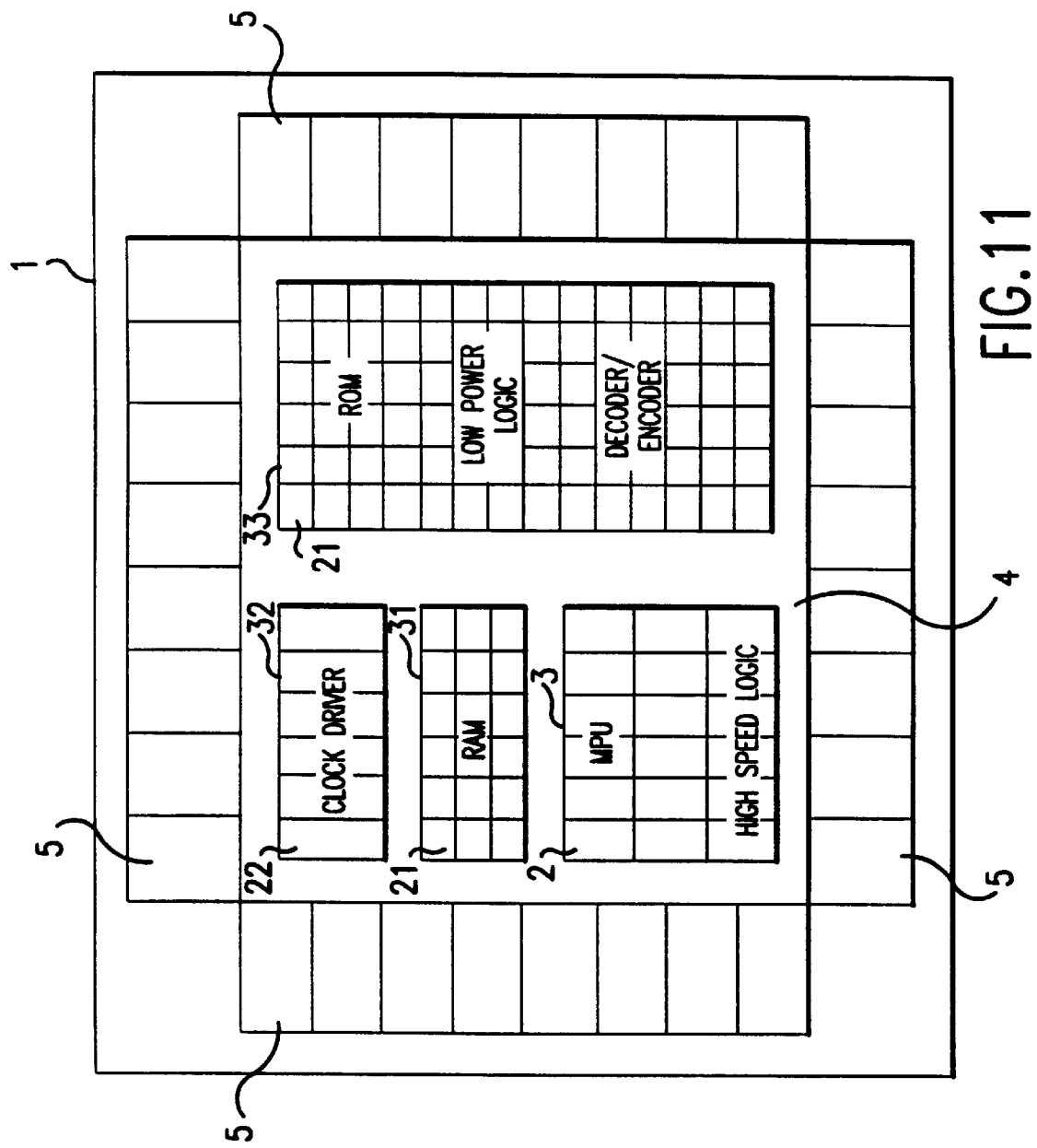
FIG. 11 is a schematic plan view of one of circuit functions assigned to each of the blocks in FIG. 1.

FIG. 11 shows a modified form of the present invention in which circuit functions are assigned to the respective block areas 3, 31, 32 and 33 shown in FIG. 1. For example, a clock driver requiring an increased output drive capacity may be allocated to the block area 32 which uses the basic cells 22 of the maximum channel width. On the other hand, the block area 31 using the basic cells 21 of the minimum channel width and part of the block area 33 are used to form RAM, ROM and other memories which are required to reduce the occupying area and power consumption as small as possible. Part of MPU or high-speed logic circuit which gives a computing speed priority over the occupying area is assigned to the block area 3 using the basic cells 2 of the standard channel width. A decoder/encoder required to reduce its power consumption rather than increasing the speed is allocated to part of the block area 33 using the basic cells 21.

The sea-of-gate type gate arrays of the prior art had the channel widths or drain capacity of the basic cells which was averaged and standardized to meet the general specification of logic circuit to the utmost. However, such a specification of channel width, drain capacity and other factors is much larger than those of the conventional RAM, ROM and so on. When the basic cells are used to form a memory cell, the capacities of gate and junction more than the necessity will be added to reduce the economy and efficiency in the viewpoint of integration, power consumption and other factors. According to this embodiment, the characteristics of the function circuit in each block area, including speed, power consumption and others, can be optimized by changing the channel widths of the MOS transistors, in comparison with the conventional gate arrays.

Second Embodiment

Figure 12:
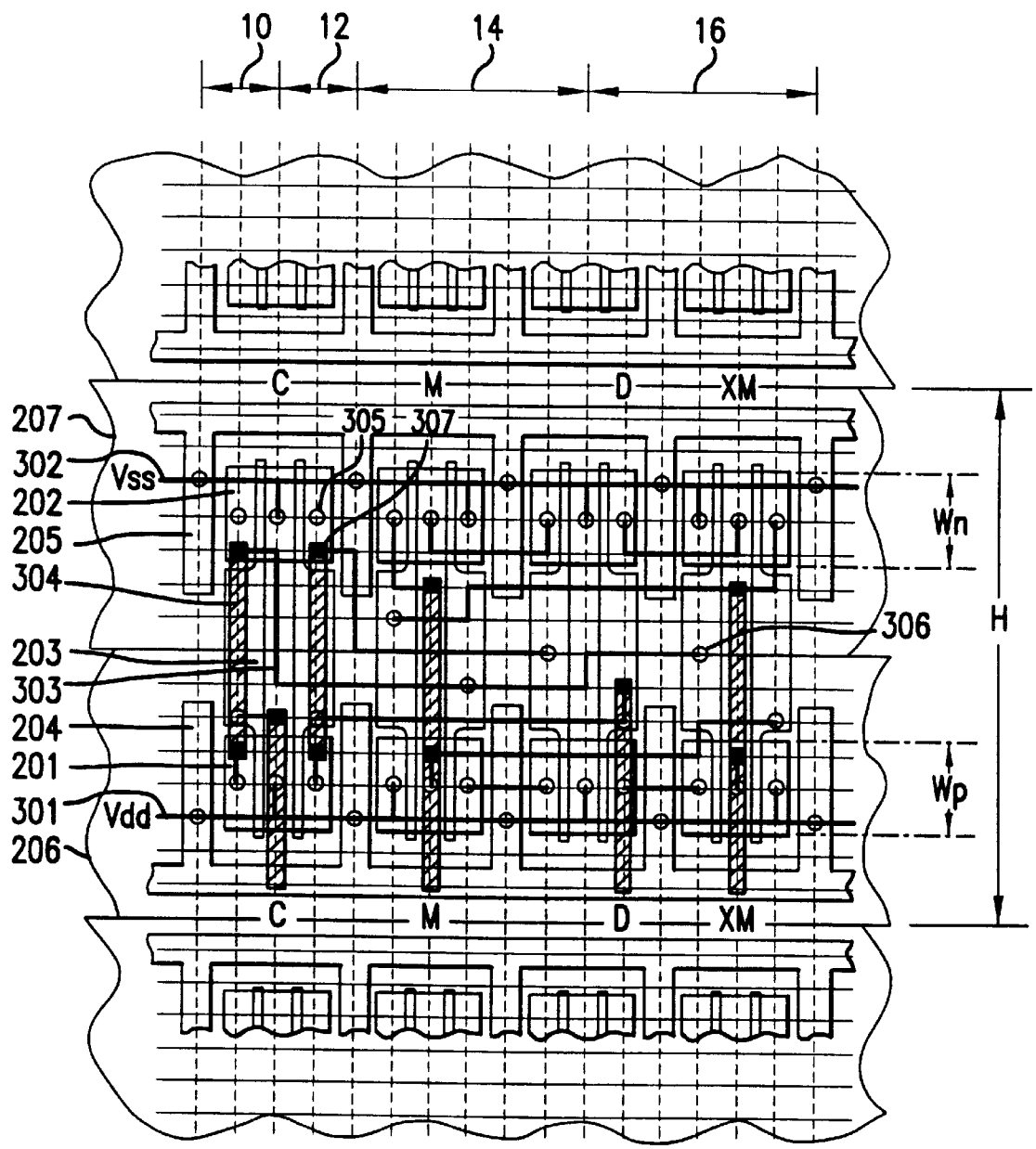
FIG. 12 is a layout of a modified form where the island-like polysilicon wiring layer of FIG. 3 is removed.
Figure 13:
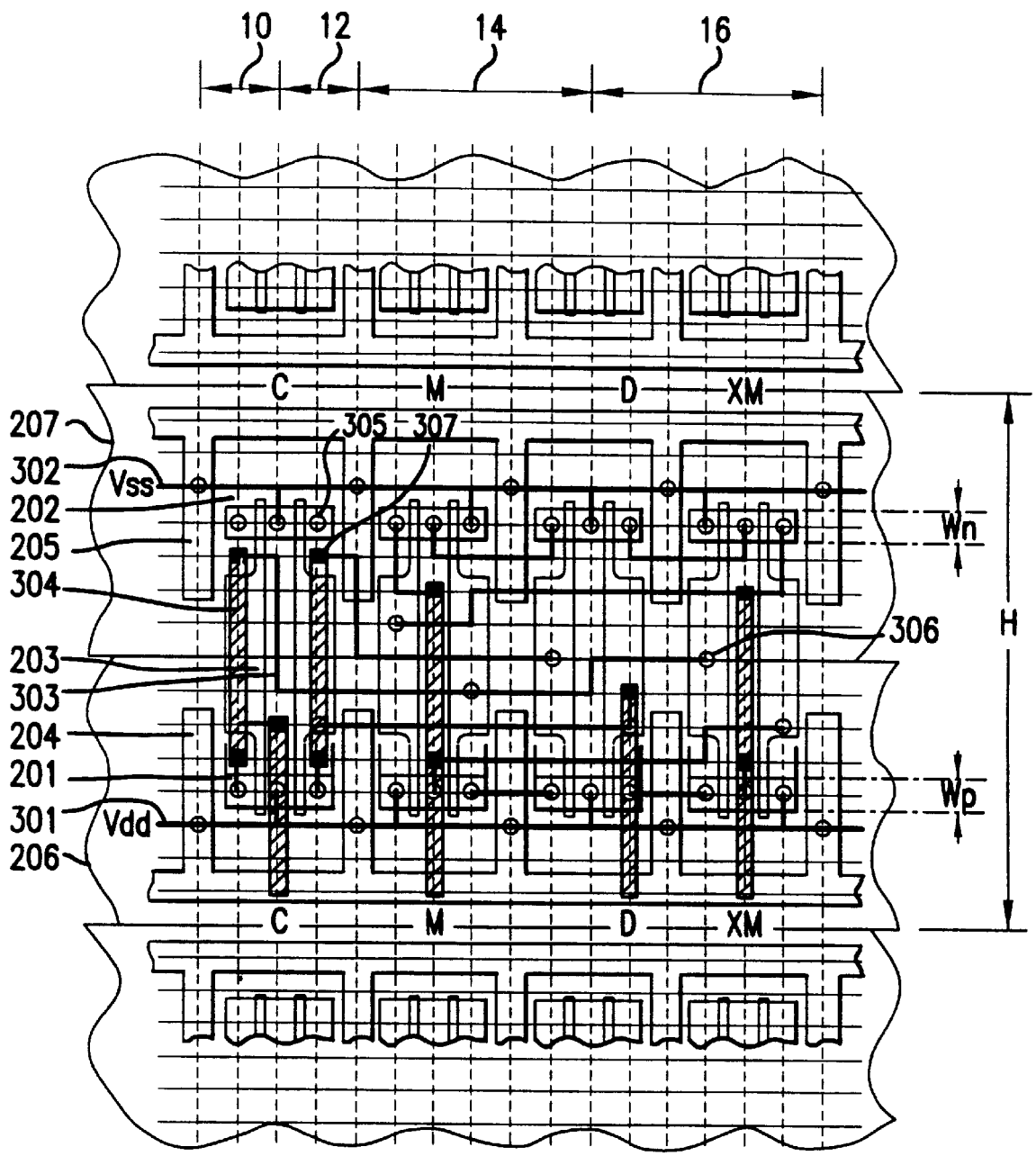
FIG. 13 is a layout of a modified form where the island-like polysilicon wiring layer of FIG. 4 is removed.
Figure 14:
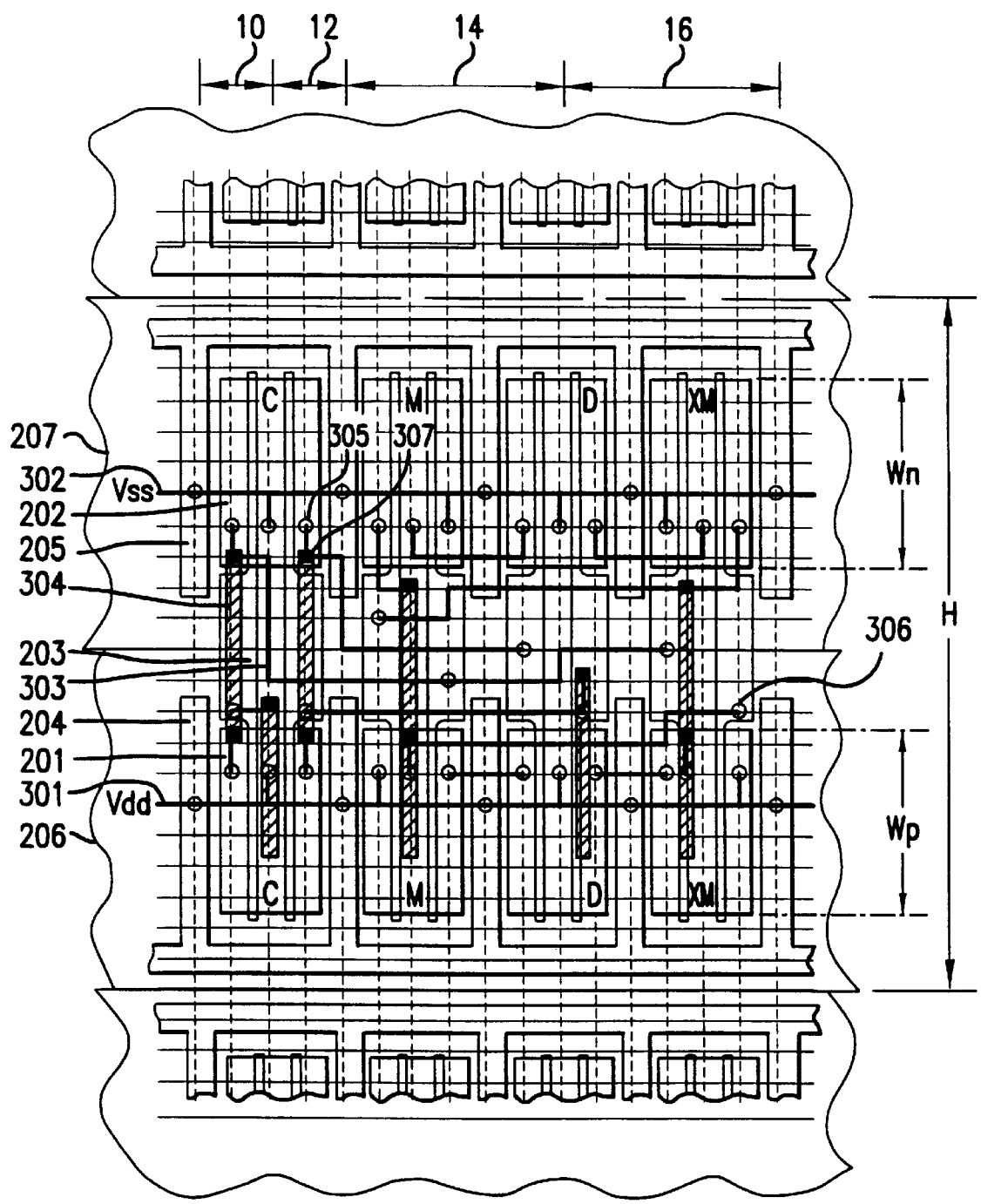
FIG. 14 is a layout of a modified form where the island-like polysilicon wiring layer of FIG. 5 is removed.

FIGS. 12–14 show forms modified from those of FIGS. 3–5. The forms of FIGS. 12–14 are different from those of FIGS. 3–5 in that no island-like wiring layer 310 is formed between two gate electrodes 203. In the layouts of FIGS. 12–14, thus, the number of the second and third contacts 306, 308 increases while the area of the first and second metal lines 303, 304 increases, in comparison with the layouts of FIGS. 3–5. The embodiments of FIGS. 12–14 are the same as those of FIGS. 3–5 except the above respects. Similarly, the semiconductor substrates worked can be stocked until the polysilicon film forming step. The first layer metal lines 303 can be terminated within the area between the first layer Vdd and Vss metal lines 301, 302.

Figure 15:
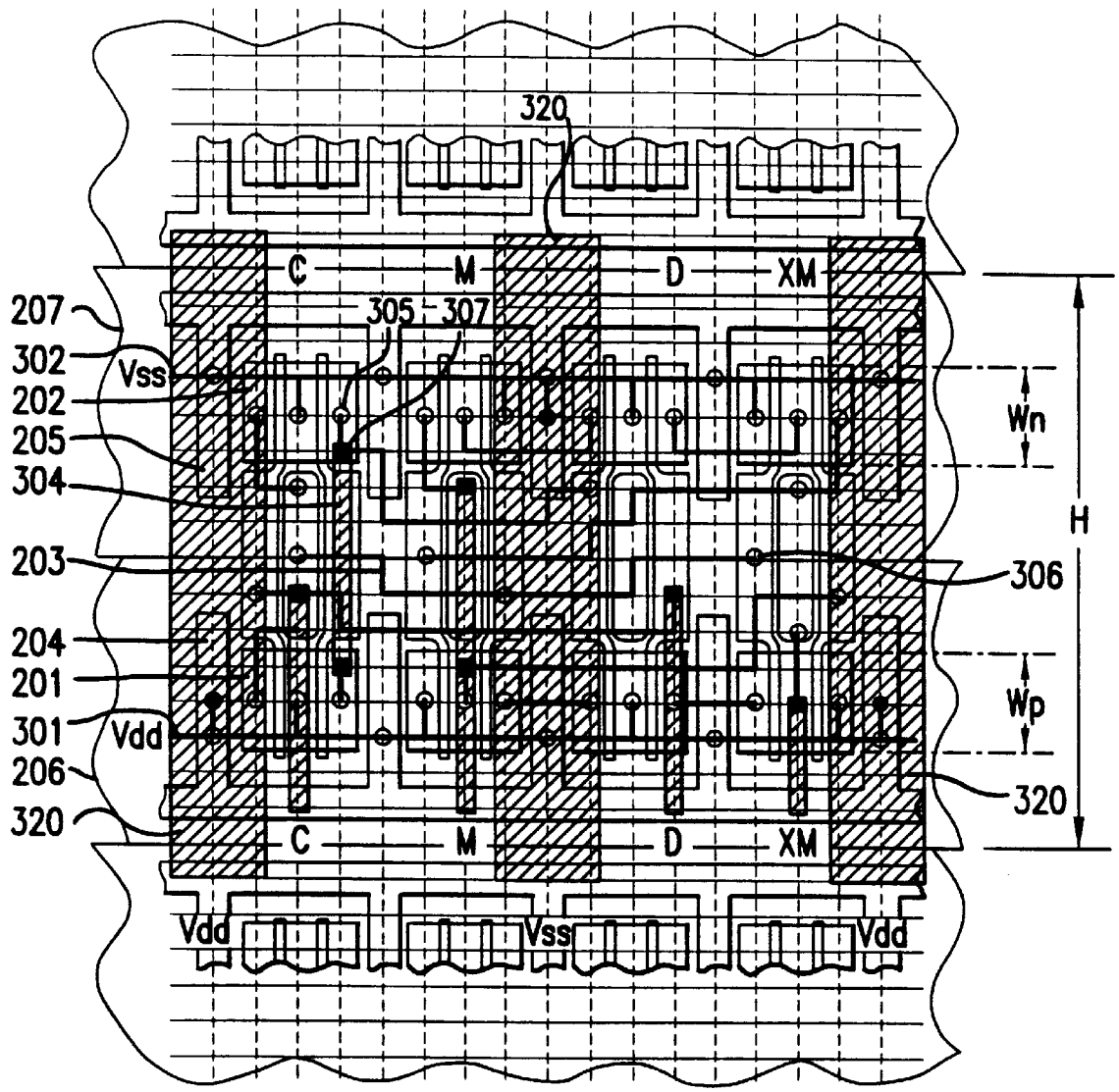
FIG. 15 is a layout when a wider power source reinforcing wiring is added to the structure of FIG. 3 by a second wiring layer.
Figure 16:
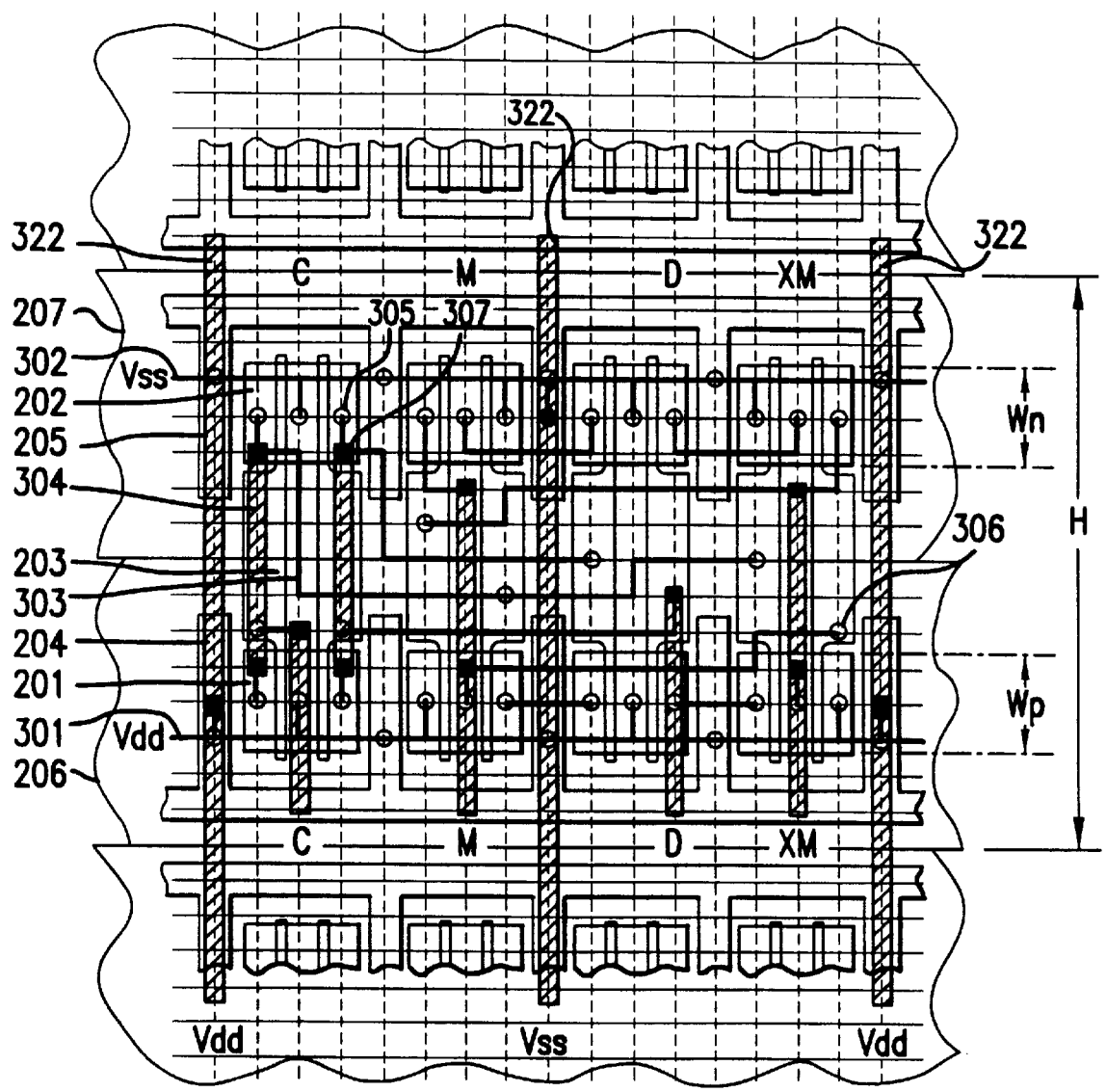
FIG. 16 is a layout when a narrower power reinforcing wiring is added to the structure of FIG. 12 by a second wiring layer.

The embodiments of FIGS. 12–14 are less advantageous than those of FIGS. 3–5 in that the layout pattern of FIGS. 3–5 can increase the freedom for reinforcing power supply connections on the same layer as the second layer metal lines 304. This respect will be described with reference to FIGS. 15 and 16. FIG. 15 shows a layout in which second metal lines 320 for reinforcing the power source are added to the form of FIG. 3. On the other hand, FIG. 16 shows another layout in which second metal lines 322 for reinforcing the power source are added to the form of FIG. 12. In the embodiment shown in FIG. 15, the second metal lines 320 can be relatively widely formed since the area occupied by the second metal lines 304 is smaller. Since such a power source reinforcement is generally performed by securing the second layer metal lines of increased width, the embodiment of FIG. 15 which increases the freedom for setting the second layer metal line area is superior to that of FIG. 16.

The present invention is not limited to the aforementioned embodiments, but may be carried out in various modified and changed forms within the scope of the invention.

The basic cells, wirings and contacts shown in FIGS. 3–5 and 12–14 can be defined to form on a common grid shown by thinner solid line. If the layout is performed on such a complete grid, the rule of design through the process can extremely be simplified. In addition, the yield can be improved since the wiring density and configuration of the whole chip is maintained invariable.

Although the layouts of FIGS. 3–5 and 12–14 have been described as to that the ratio of channel widths (Wp/Wn) of the basic cells in each of the block areas is invariable and equal to one, the present invention is not limited to such layouts. For example, the ratio Wp/Wn may be equal to two. If the grid pitch shown in FIGS. 3–5 and 12–14 is set to be equal to "1", the ratio of channel widths (Wp/Wn) in each of the block areas may be set to be equal to 6:3, 4:2, 2:1 or any other ratios.

Figure 21:
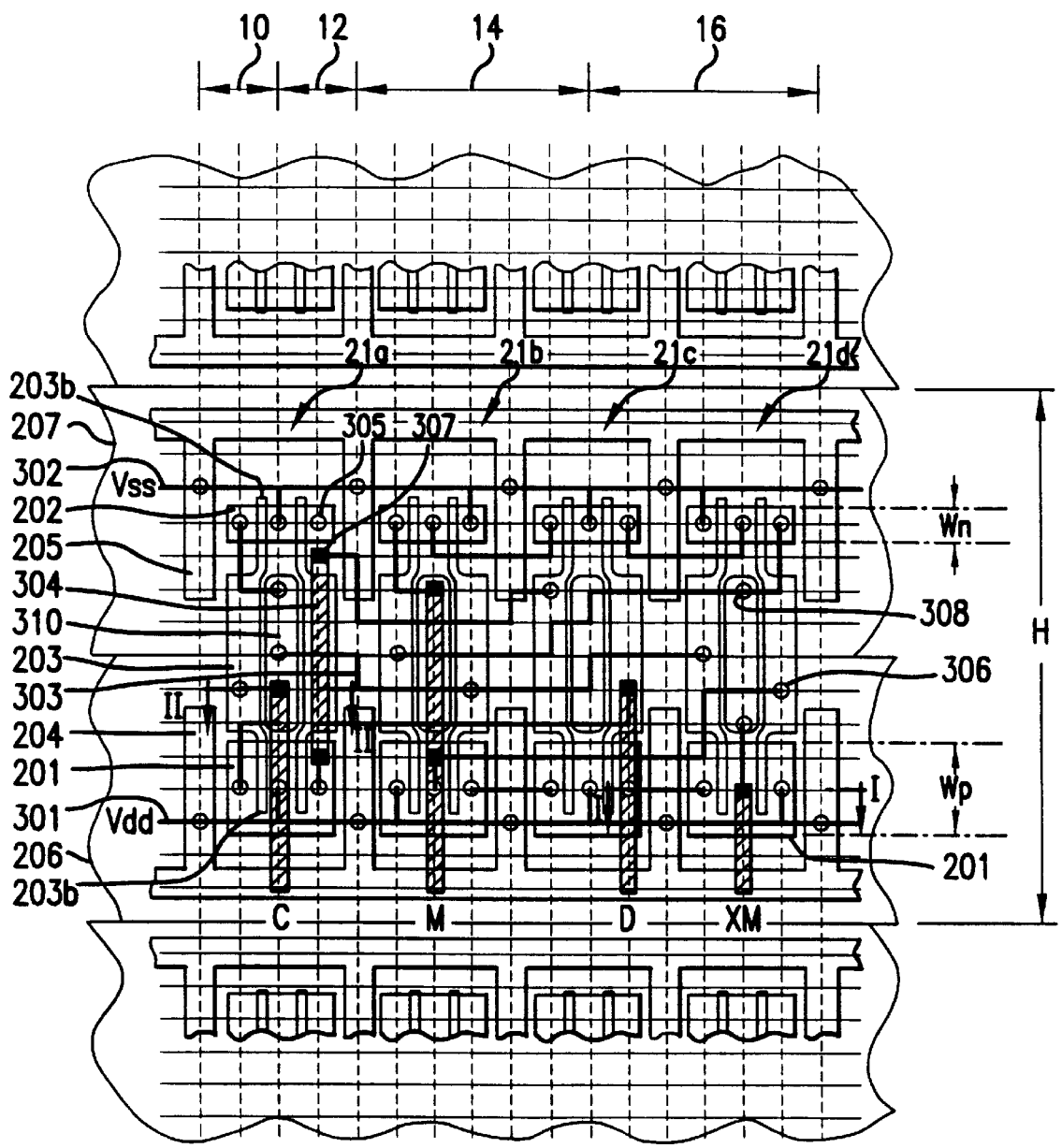
FIG. 21 is a layout of the latch circuit according to the present invention wherein the channel width ratio of the basic cells is greater than one.

FIG. 21 shows a layout of basic cells of a block area similar to block areas shown in FIGS. 3–5. The channel width ratio Wp/Wn of the basic cells in FIG. 21 is greater than 1. The first to third contacts 305, 306 and 308, respectively, and the positions of the first layer metal lines 301–303 are the second layer metal lines 304 remain the same as in FIGS. 3–5. Thus, this embodiment provides for optimization of transistors by tailoring the channel width ratio Wp/Wn based on functional needs without requiring a change in the layout of the first to third contacts 304, 306 and 308 and the pattern of the first and second layer metal lines.

In addition, the ratio of channel widths (Wp/Wn) of the basic cells in each of the block areas may be different from those of the other block areas within a certain extent. The change of the ratio of channel widths (Wp/Wn) for every block area provides the following advantage. If the channel widths of the P- and N-channel type MOS transistors are changed, the transistor characteristic value β will also be changed. The value β is an important factor which may determine the threshold when the logic circuit is used as an inverter, for example. As described, the threshold of an inverter in each of the block area can be changed by varying the ratio of channel widths of the basic cells in each block area. Thus, the system can accommodate to various source voltages such as 3.5 V, 5 V and any other higher voltages to provide the optimum logical level for the logic circuit depending on the ratio of channel widths. Therefore, an LSI capable of dealing with any one of the multiple power sources or mixedly including various logical levels.

Figure 17:
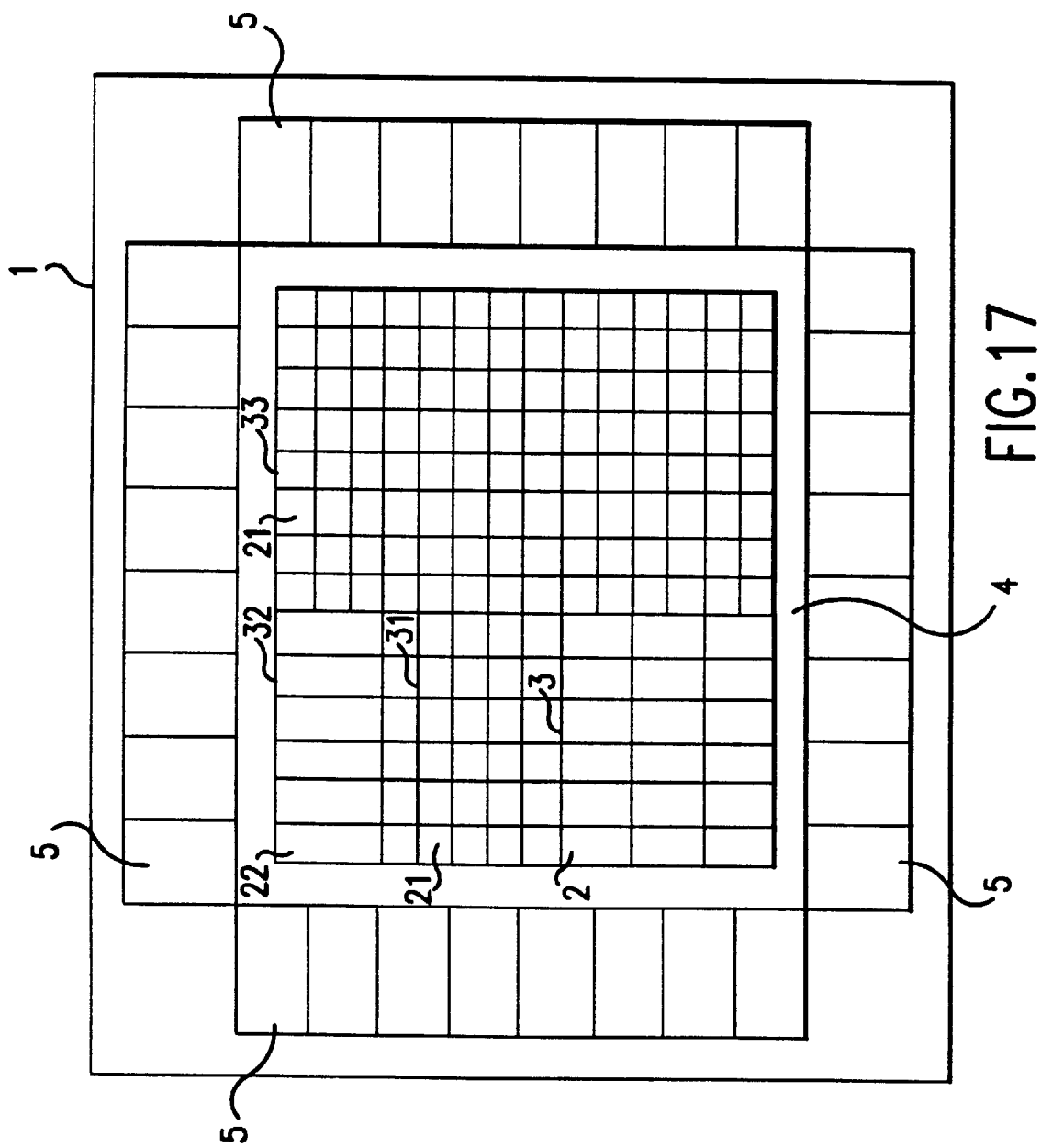
FIG. 17 is a schematic view of a modified form where the block areas of FIG. 1 are disposed close to one another.
Figure 18:
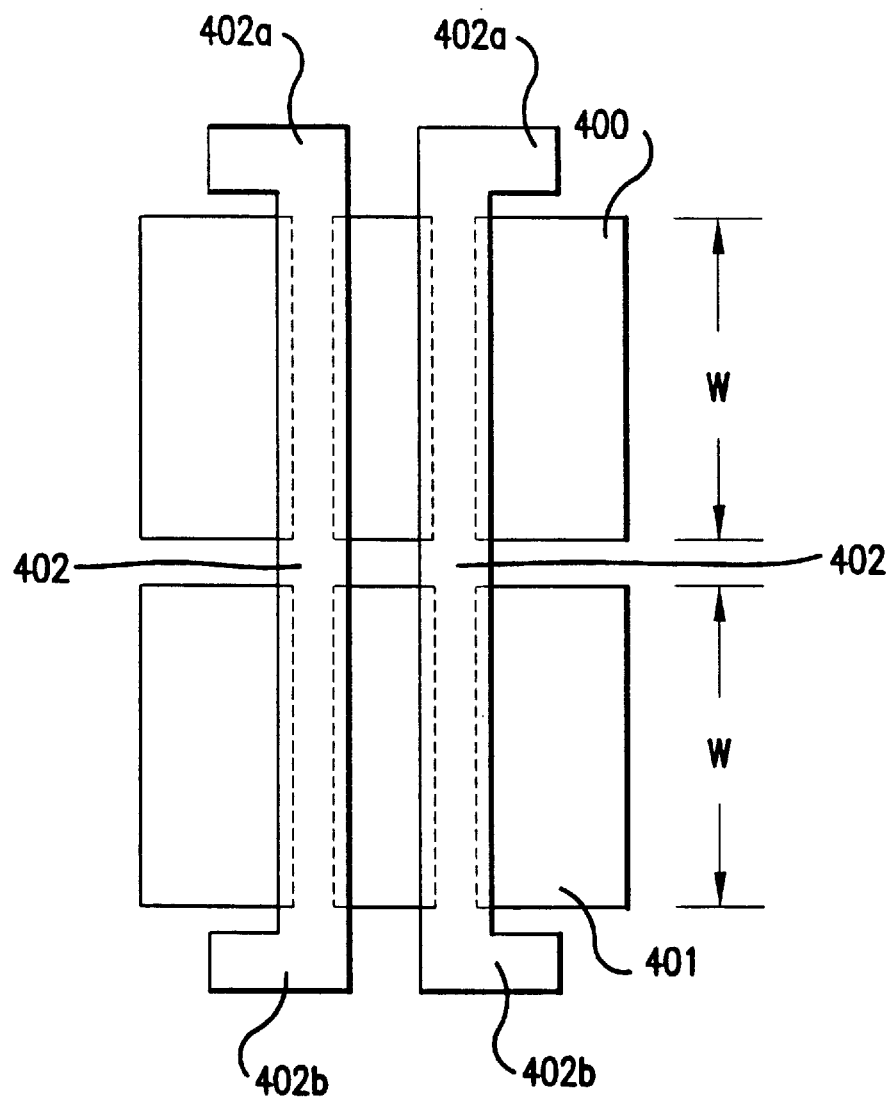
FIG. 18 is a schematic view of an basic cell according to the prior art.
Figure 19:
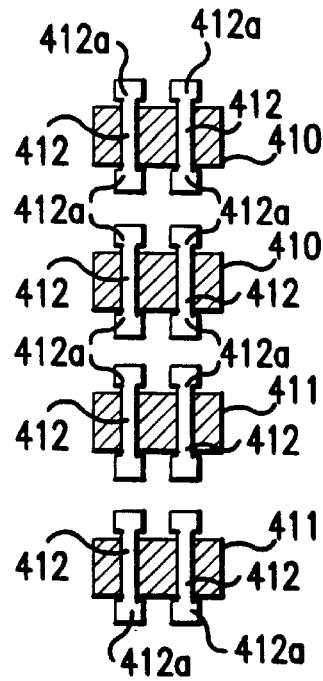
FIG. 19 is a schematic view of another basic cell according to the prior art.
Figure 20:
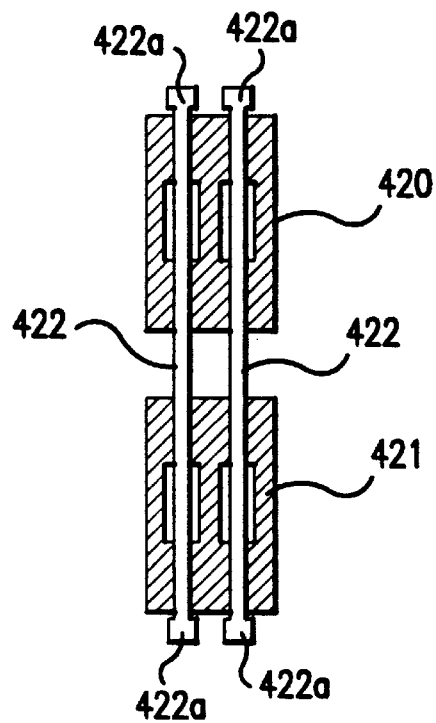
FIG. 20 is a schematic view of still another basic cell according to the prior art.

Although the layouts of FIGS. 1 and 11 have been described as to a plurality of block areas divided on the LSI chip with the block areas being disposed away from one another, the present invention is not limited to such an arrangement. For example, FIG. 17 shows an layout in which a plurality of block areas 3, 31, 32 and 33 are located close to one another on the LSI chip without any area between the adjacent block areas as in the conventional sea-of-gate type gate arrays. If the blocks 3, 31, 32 and 33 are arranged close to one another as shown in FIG. 17, the exclusive wiring area 4 for connecting the input/output cells 5 to the function cells in the respective block areas may be located only between the outer periphery of the chip connecting the block areas together and the input/output cells 5. As shown in FIGS. 1 and 11, on the other hand, the exclusive wiring area 4 may be provided between the adjacent block areas if the block areas 3, 31, 32 and 33 are located spaced away from one another.

As described, the present invention can improve the characteristics such as speed, integration, power consumption and others throughout the whole LSI chip by previously arranging, on the matrix, the basic cells having the channel widths optimum for the performances required by the function cells for every function block.

By further providing any invariable layout to the function cells even if the ratio of channel widths in the transistors are changed, the number of steps for developing the layout of the function cells can greatly be reduced, which would be separately and newly developed by the prior art.

Since the layout pattern of the function cells is invariable, the relationship between the electrical characteristics (speed, power consumption, input capacity, output drive capacity and the like) of the different groups of function cells defined by the basic cells can easily be predicted.

This improves the accuracy in the circuit simulation carried out before the actual formation of LSI circuit.

In addition, a variety of libraries for preparing the LSI chips can be provided in an easier manner than those of the conventional gate arrays and standard cells. Therefore, there can be realized a master slice type LSI which is more optimized in performance.

I claim:

1. A method of making a master slice type integrated circuit system defining any one of various LSI chips by dividing a semiconductor substrate into a plurality of block areas, disposing P- and N-channel type MOS transistors having channel widths predetermined in every block area, in an opposed relationship for every block area to form basic cells within each of said block areas by wiring at least one row of said basic cells in each of the block areas, said method comprising the steps of:

(a) forming P- and N-wells in adjacent areas within each of said block areas on the semiconductor substrate;

(b) forming LOCOS in the field parts of said P- and N-wells and thinner oxide films in areas other than said field parts;

(c) covering said LOCOS and thinner oxide films with a polysilicon layer;

(d) etching said polysilicon layer to form gate electrodes each having a length corresponding to the channel width predetermined in every block area;

(e) ion-implanting N- and P-type impurities into said P- and N-wells through self-alignment of said gate electrodes to form N- and P-type diffusion regions having their channel widths predetermined in every block area;

(f) thereafter forming a first insulation film and forming first contact holes at positions opposing to said N- and P-type diffusion regions and second contact holes at a position opposing to said gate electrodes; and (g) forming, on said first insulation layer, a first wiring layer for connecting said basic cells in each of said block areas to one another at least in one row to form a function cell and power source wiring layers Vdd and Vss for supplying the power to the function cells, said first and second contact holes in each of said block areas being disposed in an area between said power source wiring layers Vdd and Vss, the wiring by said first wiring layer for forming the function cells being completed within an area between said power source wiring layers Vdd and Vss irrespectively of the magnitude of said channel widths.

2. A method as defined in claim 1 wherein a plurality of said first contact holes are arranged in a row parallel to said P- and N-channel type MOS transistors in each of said block areas in the a step of forming said first contact holes.

3. A method as defined in claim 1 wherein said second contact holes are disposed in an area between the P- and N-channel type MOS transistors opposed to one another in the step of forming said second contact holes.

4. A method as defined in claim 1 wherein said steps (d) and (e) are revised depending on changes of the channel widths during or after said steps (a)–(c) and wherein said steps (f) and (g) are carried out according to a predetermined design relating to the position of said first and second contact holes as well as the wiring pattern of said first wiring layer.

5. A method as defined in claim 1 wherein a plurality of said gate electrodes are located substantially parallel to one another between said opposed P- and N-channel type MOS transistors and wherein an island-like wiring layer is formed in an area between said gate electrodes in the same plane as that of said gate electrodes, said island-like wiring layer being made of the same conductive material as that of said gate electrodes in the step of forming said gate electrodes, and wherein third contact holes are formed in said first insulation layer at a position opposite to said island-like wiring layer in the step of forming said contact holes.

6. A method as defined in claim 5, further comprising the steps of forming a second insulation layer on the upper layer of said first wiring layer, forming a plurality of VIA holes in said second insulation layer and forming a second wiring layer on the upper layer of said first insulation layer, said second wiring layer being connected to said first wiring layer through said VIA holes and wherein a power source reinforcing wiring layer is formed at an area enlarged by providing said island-like wiring layer in the same plane as that of said second wiring layer but out of the area occupied by said second wiring layer.

* * * * *